US012701839B2

(12) United States Patent
Kang et al.

(10) Patent No.: US 12,701,839 B2
(45) Date of Patent: Aug. 4, 2026

(54) DISPLAY DEVICE AND METHOD OF MANUFACTURING DISPLAY DEVICE

(71) Applicant: LG Display Co., Ltd., Seoul (KR)

(72) Inventors: MinJae Kang, Seoul (KR); YongSeok Kwak, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 698 days.

(21) Appl. No.: 17/895,768

(22) Filed: Aug. 25, 2022

(65) Prior Publication Data

US 2023/0066130 A1     Mar. 2, 2023

(30) Foreign Application Priority Data

Sep. 1, 2021     (KR) ......................... 10-2021-0116484

(51) Int. Cl.
*H10H 20/857*     (2025.01)
*G09G 3/3233*     (2016.01)
(Continued)

(52) U.S. Cl.
CPC ......... *H10H 20/857* (2025.01); *G09G 3/3233* (2013.01); *H10W 90/00* (2026.01);
(Continued)

(58) Field of Classification Search
CPC ... H10H 20/00–882; H10H 29/00–142; H10H 29/30–962
See application file for complete search history.

(56) References Cited

U.S. PATENT DOCUMENTS

2019/0088707 A1     3/2019  Do et al.
2020/0005703 A1     1/2020  Kim et al.
(Continued)

FOREIGN PATENT DOCUMENTS

CN     110649135 A     1/2020
CN     111613149 A     9/2020
(Continued)

OTHER PUBLICATIONS

GB Search Report dated Feb. 10, 2023, issued in corresponding Application No. GB2211596.8.
(Continued)

*Primary Examiner* — Jeff W Natalini
*Assistant Examiner* — Andrew John Zabel
(74) *Attorney, Agent, or Firm* — Morgan, Lewis & Bockius LLP

(57) ABSTRACT

A display device and a method of manufacturing the display device are disclosed. A display device includes a substrate, a plurality of first lines disposed on the substrate and spaced apart from each other, a plurality of second lines disposed on the substrate and disposed between the plurality of respective first lines, a plurality of light emitting elements disposed on the plurality of first lines and the plurality of second lines, and a plurality of third lines disposed on the plurality of light emitting elements. Each of the plurality of light emitting elements includes a first semiconductor layer overlapping the plurality of first lines and electrically connected to the plurality of first lines and the plurality of second lines, a light emitting layer, a second semiconductor layer, a conductor layer in contact with the plurality of third lines, and a non-conductor layer overlapping the plurality of second lines.

10 Claims, 22 Drawing Sheets

(51) Int. Cl.

| | |
|---|---|
| *H10H 20/01* | (2025.01) |
| *H10H 29/30* | (2025.01) |
| *H10W 90/00* | (2026.01) |
| *H10W 70/05* | (2026.01) |
| *H10W 70/60* | (2026.01) |
| *H10W 70/652* | (2026.01) |
| *H10W 70/654* | (2026.01) |
| *H10W 72/00* | (2026.01) |
| *H10W 90/22* | (2026.01) |

(52) U.S. Cl.

CPC ............... *G09G 2300/0426* (2013.01); *G09G 2300/0842* (2013.01); *H10H 20/0364* (2025.01); *H10H 29/30* (2025.01); *H10W 70/093* (2026.01); *H10W 70/60* (2026.01); *H10W 70/6528* (2026.01); *H10W 70/654* (2026.01); *H10W 72/0198* (2026.01); *H10W 90/22* (2026.01)

(56) References Cited

U.S. PATENT DOCUMENTS

| | | | | |
|---|---|---|---|---|
| 2020/0212262 A1* | 7/2020 | Jang | ................... | H01L 25/0756 |
| 2020/0273397 A1 | 8/2020 | Jeong et al. | | |
| 2020/0273906 A1 | 8/2020 | Li et al. | | |
| 2021/0134769 A1 | 5/2021 | Kam et al. | | |
| 2021/0296537 A1* | 9/2021 | Lee | ................... | H10H 20/8312 |
| 2021/0367109 A1* | 11/2021 | Song | ................... | H01L 25/0753 |
| 2021/0399043 A1 | 12/2021 | Lee et al. | | |
| 2022/0013509 A1* | 1/2022 | Lee | ....................... | H10D 86/441 |
| 2022/0359478 A1 | 11/2022 | Li et al. | | |
| 2022/0415850 A1 | 12/2022 | Lee et al. | | |
| 2023/0123503 A1* | 4/2023 | Oh | ....................... | H10H 20/857 257/91 |
| 2023/0155059 A1* | 5/2023 | Lee | ....................... | G02F 1/1362 257/79 |
| 2023/0246133 A1* | 8/2023 | Cha | ........................... | G09G 3/32 257/91 |
| 2023/0246134 A1* | 8/2023 | Lee | ....................... | H10H 20/857 257/79 |
| 2023/0282777 A1* | 9/2023 | Moon | .................. | H10H 20/819 257/79 |
| 2023/0361259 A1* | 11/2023 | Yun | ....................... | H10D 86/60 |

FOREIGN PATENT DOCUMENTS

| | | |
|---|---|---|
| KR | 10-2020-0014955 A | 2/2020 |
| KR | 10-2020-0103925 A | 9/2020 |
| KR | 10-2020-0144189 A | 12/2020 |
| KR | 10-2021-0081506 A | 7/2021 |
| WO | 2020/25670 A1 | 12/2020 |
| WO | 2020/256270 A1 | 12/2020 |

OTHER PUBLICATIONS

Office Action dated Jul. 1, 2025 issued in counterpart KR Application No. 10-2021-0116484.

Office Action dated May 21, 2026 issued in corresponding Chinese Patent Application No. 202210949790.2.

\* cited by examiner

— 135

— 134

— 133

— 132

— 131

PR

836

131m

WF

DISPLAY DEVICE AND METHOD OF MANUFACTURING DISPLAY DEVICE

CROSS-REFERENCE TO RELATED APPLICATIONS

This application claims the benefit of and priority to Korean Patent Application No. 10-2021-0116484 filed on Sep. 1, 2021, in the Republic of Korea, the entire contents of which are hereby expressly incorporated by reference into the present application.

BACKGROUND

Technical Field

The present disclosure relates to a display device and a method of manufacturing the display device, and more particularly, to a display device using a light emitting diode (LED) and a method of manufacturing the display device.

Discussion of the Related Art

Display devices used in computer monitors, TVs, and mobile phones include organic light emitting displays (OLEDs) that emit light by themselves, and liquid crystal displays (LCDs) that require a separate light source.

Such display devices are being applied to more and more various fields including not only computer monitors and TVs, but also personal mobile devices, and thus, display devices having a reduced volume and weight while having a wide display area are being studied.

In recent years, display devices including light emitting diodes (LEDs) have received attention as next-generation display devices. Since the LED is formed of an inorganic material rather than an organic material, it has excellent reliability and has a longer lifespan compared to a liquid crystal display or an organic light emitting display. In addition, the LED has a high lighting speed, high luminous efficiency and excellent stability due to high impact resistance and can display a high-brightness image.

SUMMARY

Accordingly, embodiments of the present disclosure are directed to a display device and a method of manufacturing a display device that substantially obviate one or more of the problems due to limitations and disadvantages of the related art.

An aspect of the present disclosure is to provide a display device allowing for self-alignment of light emitting elements.

Another aspect of the present disclosure is to provide a display device allowing for lines to be normally connected to light emitting elements without limiting alignment directions of semiconductor layers of the light emitting elements.

Another aspect of the present disclosure is to provide a display device in which an assembly rate of light emitting elements is improved by changing a position where the light emitting element and the line are connected.

Another aspect of the present disclosure is to provide a display device allowing for a reduction in a manufacturing cost by improving an assembly rate of light emitting elements.

Another aspect of the present disclosure is to provide a display device using lines for self-alignment of light emitting elements as lines for driving the light emitting elements.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display device comprises a substrate, a plurality of first lines disposed on the substrate and spaced apart from each other, a plurality of second lines disposed on the substrate and disposed between the plurality of respective first lines, a plurality of light emitting elements disposed on the plurality of first lines and the plurality of second lines, and a plurality of third lines disposed on the plurality of light emitting elements. Each of the plurality of light emitting elements includes a first semiconductor layer overlapping the plurality of first lines and electrically connected to the plurality of first lines and the plurality of second lines, a light emitting layer disposed at one side of the first semiconductor layer, a second semiconductor layer disposed at one side of the light emitting layer, a conductor layer disposed at one side of the second semiconductor layer and in contact with the plurality of third lines, and a non-conductor layer disposed at one side of the conductor layer and overlapping the plurality of second lines. Accordingly, the plurality of light emitting elements may be self-aligned on the substrate using the plurality of first lines and the plurality of second lines.

In another aspect, a display device comprises a substrate on which a plurality of sub-pixels are defined, a driving transistor disposed in each of the plurality of sub-pixels on the substrate; a plurality of light emitting elements disposed in each of the plurality of sub-pixels on the substrate, a plurality of first lines disposed between the driving transistor and the plurality of light emitting elements and electrically connected to the driving transistor, a plurality of second lines disposed between the plurality of first lines between the driving transistor and the plurality of light emitting elements and electrically connected to the driving transistor, and a plurality of third lines disposed on the plurality of light emitting elements and in contact with central portions of each of the plurality of light emitting elements. Each of the plurality of light emitting elements includes, a first semiconductor layer electrically connected to the plurality of first lines and the plurality of second lines, a second semiconductor layer disposed at one side of the first semiconductor layer and electrically connected to the plurality of third lines, a conductor layer having at least a portion overlapping the central portion, and disposed at one side of the second semiconductor layer, and a non-conductor layer disposed at one side of the conductor layer. Accordingly, since the plurality of light emitting elements can be normally driven by electrically connecting the plurality of light emitting elements to the driving transistor and the plurality of third lines without limitation to alignment directions of the plurality of light emitting elements, a manufacturing cost can be reduced.

In another aspect, a method of manufacturing a display device comprises forming a plurality of first lines spaced apart from each other and a plurality of second lines between the plurality of first lines on the substrate; forming a plurality of light emitting elements on the plurality of first lines and the plurality of second lines; and forming a plurality of third lines on the plurality of light emitting elements. Each of the plurality of light emitting elements includes, a first semiconductor layer overlapping the plurality of first lines and electrically connected to the plurality of first lines and the plurality of second lines; a light emitting layer disposed at one side of the first semiconductor layer; a second semiconductor layer disposed at one side of the light emitting layer; a conductor layer disposed at one side of the second semiconductor layer and in contact with the plurality of third lines; and a non-conductor layer disposed at one side of the conductor layer and overlapping the plurality of second lines.

In another aspect, a method of manufacturing a display device comprises forming a plurality of sub-pixels on a substrate; forming a driving transistor and a plurality of light emitting elements in each of the plurality of sub-pixels on the substrate; forming a plurality of first lines between the driving transistor and the plurality of light emitting elements, the plurality of first lines electrically connected to the driving transistor; forming a plurality of second lines between the plurality of first lines between the driving transistor and the plurality of light emitting elements, the plurality of second lines electrically connected to the driving transistor; and forming a plurality of third lines on the plurality of light emitting elements, the plurality of third lines being in contact with central portions of each of the plurality of light emitting elements. Each of the plurality of light emitting elements includes, a first semiconductor layer electrically connected to the plurality of first lines and the plurality of second lines; a second semiconductor layer disposed at one side of the first semiconductor layer and electrically connected to the plurality of third lines; a conductor layer having at least a portion overlapping the central portion, and disposed at one side of the second semiconductor layer; and a non-conductor layer disposed at one side of the conductor layer.

Other detailed matters of the exemplary embodiments are included in the detailed description and the drawings.

According to the present disclosure, light emitting elements can be driven by connecting the light emitting elements and lines regardless of alignment directions of semiconductor layers of the light emitting elements.

According to the present disclosure, lines for self-alignment of light emitting elements can also be used as lines for driving the light emitting elements.

According to the present disclosure, by forming a protective layer covering a portion of a light emitting element, it is possible to reduce occurrence of a short-circuit defect when the light emitting element and a driving circuit are connected.

According to the present disclosure, it is possible to improve an assembly rate of light emitting elements, thereby reducing a manufacturing cost and implementing high luminance of light.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
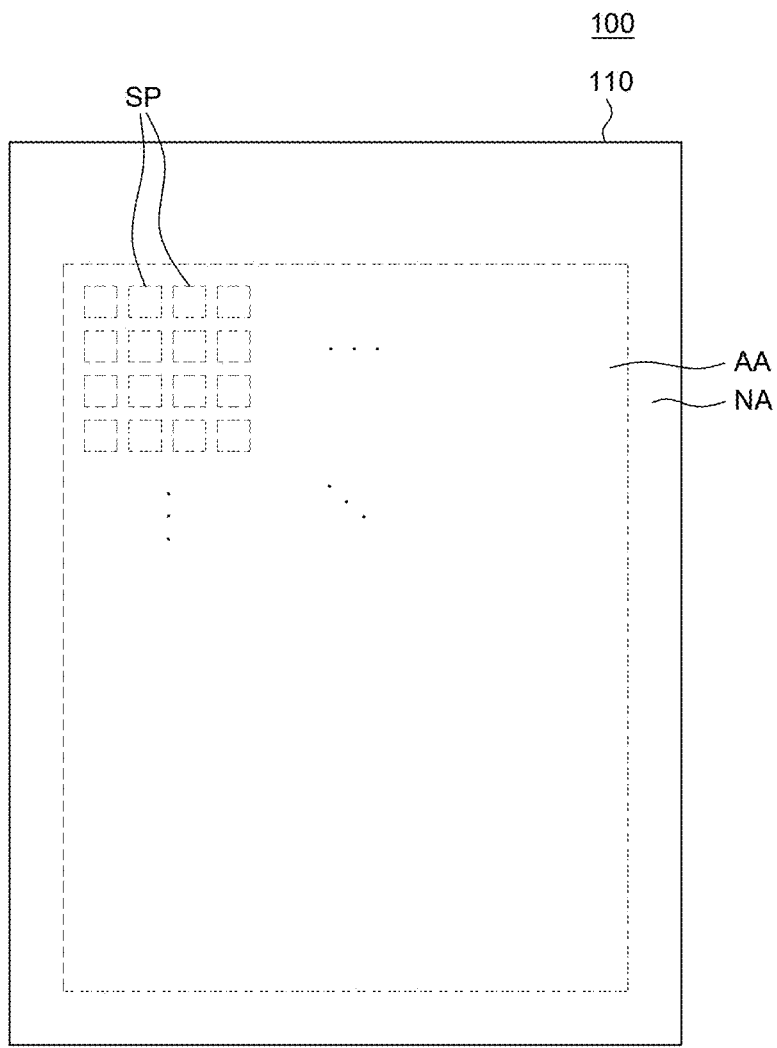
FIG. 1 is a schematic plan view of a display device according to an embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

FIG. 1 is a schematic plan view of a display device according to an embodiment of the present disclosure. In FIG. 1, only a substrate 110 and a plurality of sub-pixels SP among various components of a display device 100 are illustrated for convenience of explanation.

The substrate 110 is a component for supporting various components included in the display device 100, and may be formed of an insulating material. For example, the substrate 110 may be formed of glass, resin or the like. In addition, the substrate 110 may be formed to include a polymer or plastic, or may be formed of a material having flexibility.

The substrate 110 includes a display area AA and a non-display area NA.

The display area AA is an area in which a plurality of sub-pixels SP are disposed to display an image. Each of the plurality of sub-pixels SP is an individual unit emitting light, and light emitting elements 130 and a driving circuit are formed in each of the plurality of sub-pixels SP. For example, the plurality of sub-pixels SP may include a red sub-pixel, a green sub-pixel, a blue sub-pixel, and/or a white sub-pixel or the like, but the present disclosure is not limited thereto.

The non-display area NA is an area in which an image is not displayed, and is an area in which various lines, driver ICs, and the like for driving the sub-pixels SP disposed in the display area AA are disposed. For example, various ICs such as a gate driver IC and a data driver IC, driver circuits and the like may be disposed in the non-display area NA. Meanwhile, the non-display area NA may be positioned on a rear surface of the substrate 110, that is, a surface on which the sub-pixel SP is not present or may be omitted, and is not limited to those illustrated in drawings.

Figure 2:
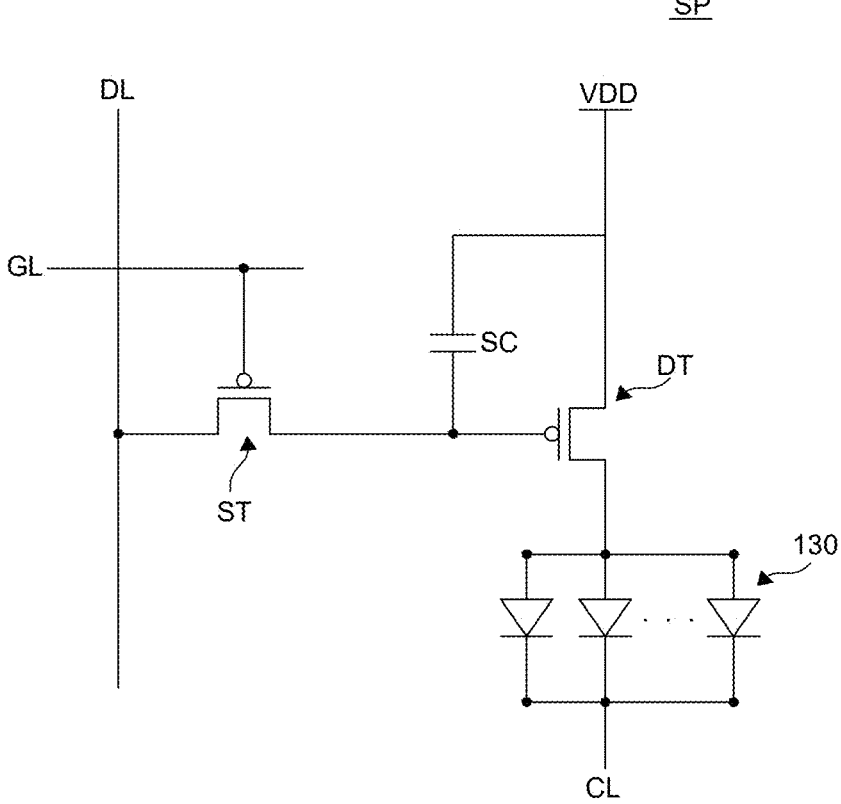
FIG. 2 is a circuit diagram of a sub-pixel of the display device according to an embodiment of the present disclosure.

Hereinafter, FIG. 2 is referred together for a more detailed description of the plurality of sub-pixels SP.

FIG. 2 is a circuit diagram of a sub-pixel of the display device according to an embodiment of the present disclosure. Referring to FIG. 2, each of the plurality of sub-pixels SP includes a switching transistor ST, a driving transistor DT, a storage capacitor SC, and the light emitting elements 130, and a plurality of lines for supplying various signals to the plurality of sub-pixels SP include a gate line GL, a data line DL, a high potential power line VDD, and a common line CL.

The switching transistor ST and the driving transistor DT of each of the plurality of sub-pixels SP include a gate electrode, a source electrode, and a drain electrode. The switching transistor ST and the driving transistor DT may be a P-type thin film transistor or an N-type thin film transistor. For example, in the P-type thin film transistor, since holes move from a source electrode to a drain electrode, current may flow from the source electrode to the drain electrode. In the N-type thin film transistor, since electrons move from the source electrode to the drain electrode, current may flow from the drain electrode to the source electrode. Hereinafter, it is assumed that the switching transistor ST and the driving transistor DT are P-type thin film transistors in which current flows from the source electrode to the drain electrode, but the present disclosure is not limited thereto.

First, the switching transistor ST is a transistor that transfers a data voltage to the gate electrode of the driving transistor DT. The switching transistor ST includes a gate electrode connected to the gate line GL, a source electrode connected to the data line DL, and a drain electrode connected to the gate electrode of the driving transistor DT. The switching transistor ST may be turned on by a signal from the gate line GL, and a data voltage from the data line DL may be transmitted to the gate electrode of the driving transistor DT through the switching transistor ST which is turned on.

The driving transistor DT is a transistor that supplies a driving current to the light emitting element 130. The driving transistor DT includes a gate electrode connected to the switching transistor ST, a source electrode connected to the high potential power line VDD, and a drain electrode connected to the light emitting element 130. The driving transistor DT may be turned on based on the data voltage which is transferred through the switching transistor ST. In addition, the driving transistor DT which is turned on may control a driving current flowing to the light emitting element 130.

The storage capacitor SC may store a potential difference between the gate electrode and the source electrode of the driving transistor DT while the light emitting element 130 emits light, so that a constant driving current may be supplied to the light emitting element 130. The storage capacitor SC includes a plurality of electrodes. Some electrodes of the storage capacitor SC may be connected to the gate electrode of the driving transistor DT, and remaining electrodes thereof may be connected to the source electrode of the driving transistor DT.

A plurality of the light emitting elements 130 are disposed in one sub-pixel SP. The plurality of light emitting elements 130 are light emitting elements 130 that emit light by an electric current. The plurality of light emitting elements 130 may include the light emitting elements 130 emitting red light, green light, blue light, and the like, and a combination thereof may implement light of various colors including white. In addition, various colors of light may be implemented by using the light emitting elements 130 that emit light of a specific color and a light conversion member that converts the light from the light emitting elements 130 into light of a different color. For example, the light emitting element 130 may be a light emitting diode (LED) or a micro-LED, but is not limited thereto.

The light emitting element 130 includes a first semiconductor layer, a second semiconductor layer, and a light emitting layer between the first semiconductor layer and the second semiconductor layer. The first semiconductor layer of the light emitting element 130 is connected to the driving transistor DT, and the second semiconductor layer thereof is connected to the common line CL. The light emitting element 130 may receive a driving current from the driving transistor DT and emit light.

In one sub-pixel SP, the plurality of light emitting elements 130 may be connected in parallel. That is, the first semiconductor layers of each of the plurality of light emitting elements 130 may be connected to the drain electrode of the same driving transistor DT, and the second semiconductor layers thereof may be connected to the same common line CL.

Meanwhile, although it is described that in FIG. 2, the driving circuit of the sub-pixel SP of the display device 100 according to an embodiment of the present disclosure has a structure including two transistors ST and DT and one storage capacitor SC, the number and connection relationship of the transistors and the storage capacitor may be variously changed according to design, but are not limited thereto.

Hereinafter, FIGS. 3A to 5 are referred together for a more detailed description of the plurality of sub-pixels SP.

Figure 3A:
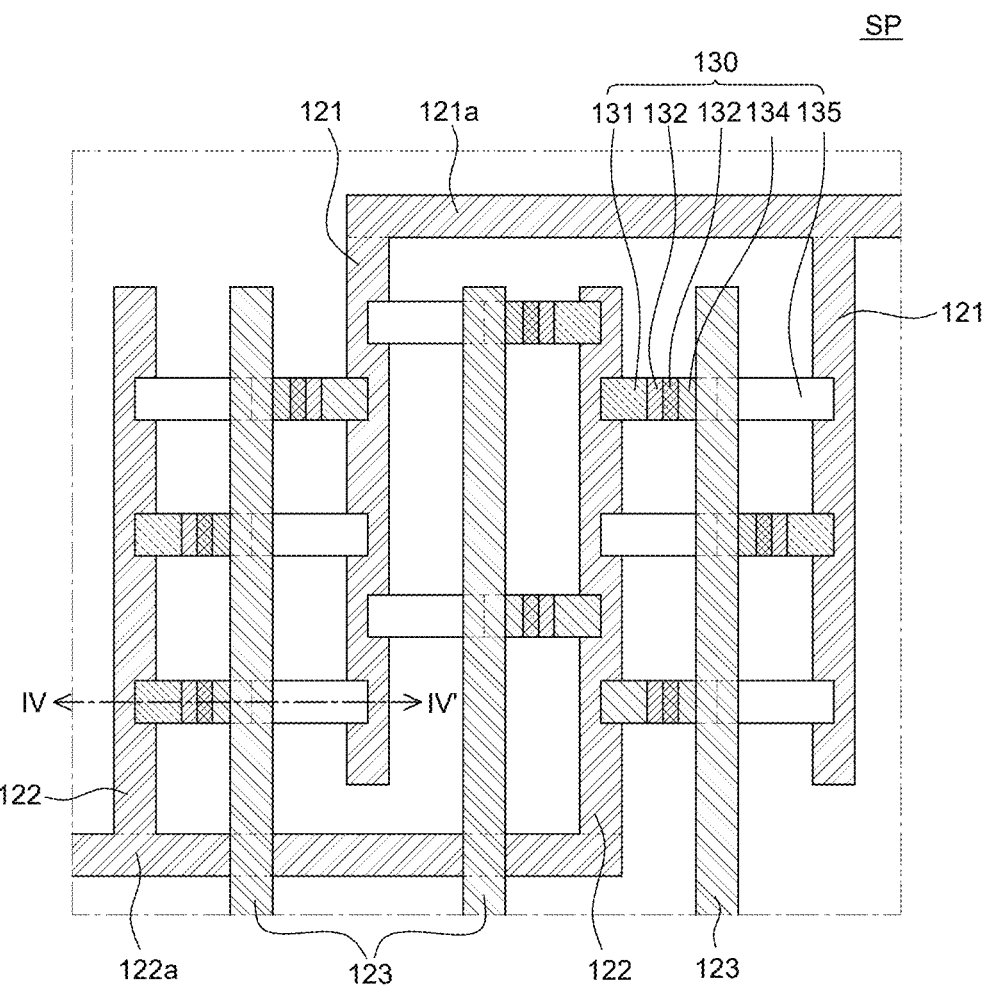
FIGS. 3A and 3B are schematic plan views of sub-pixels of the display device according to an embodiment of the present disclosure.
Figure 3B:
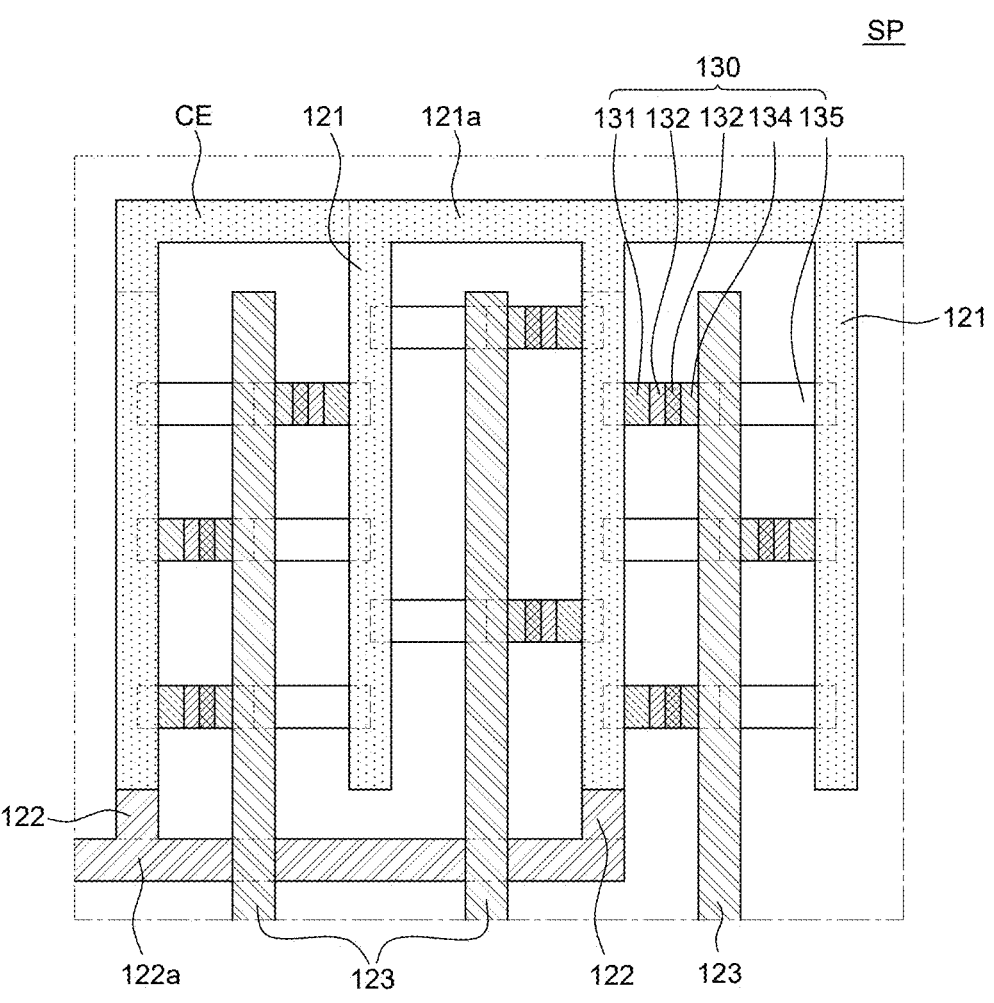
Figure 4A:
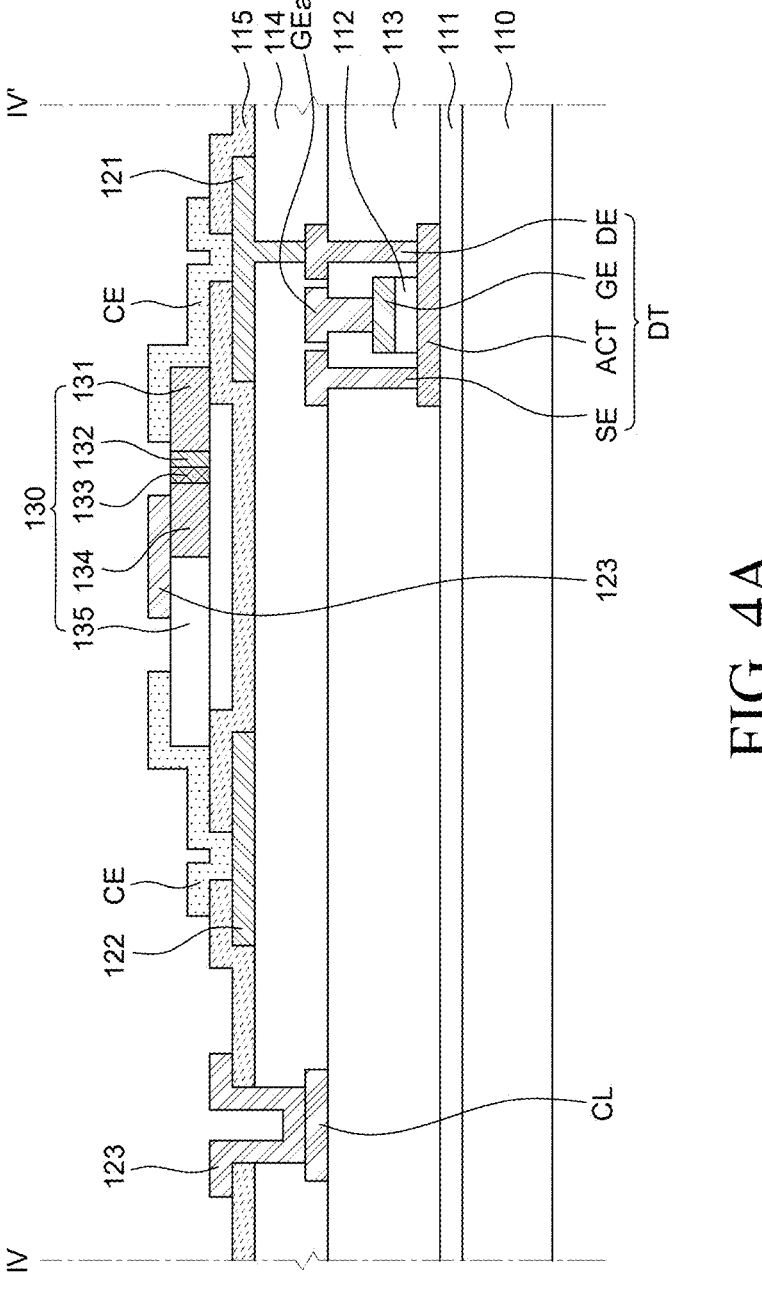
FIGS. 4A and 4B are cross-sectional views taken along line IV-IV' of FIG. 3A.
Figure 4B:
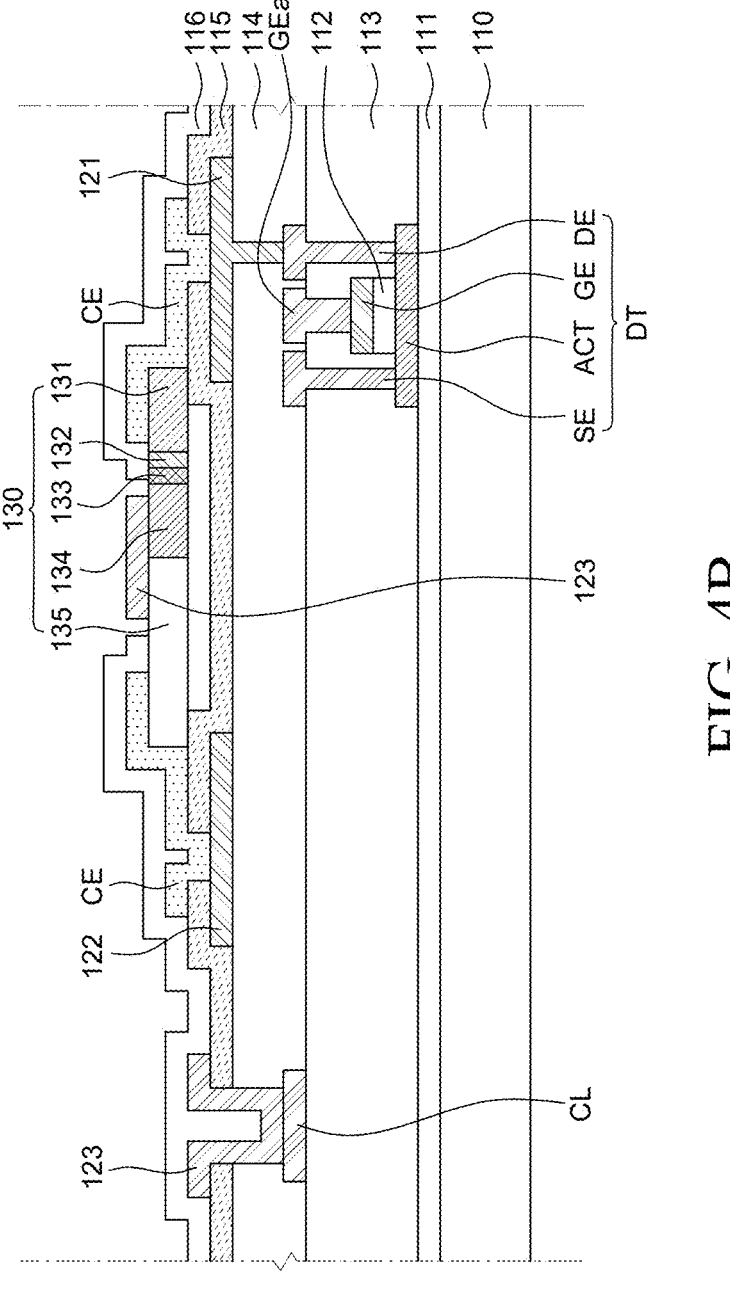
Figure 5:
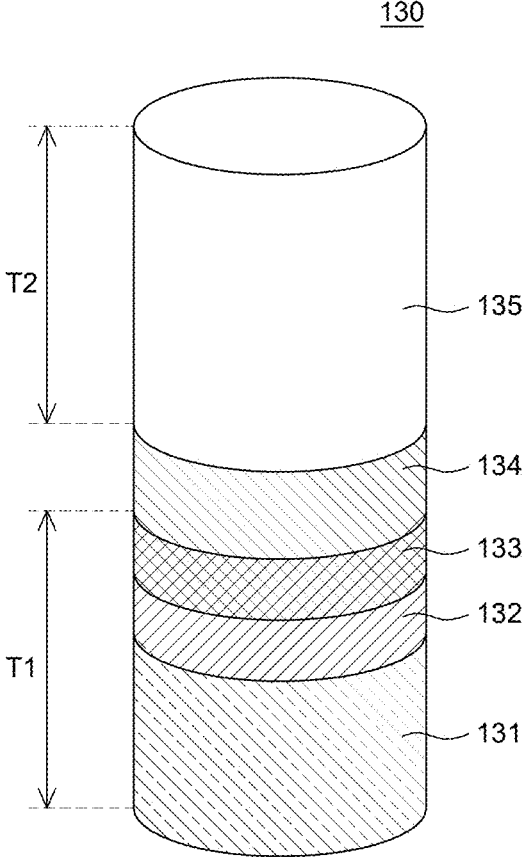
FIG. 5 is a perspective view of a light emitting element of the display device according to an embodiment of the present disclosure.

FIGS. 3A and 3B are schematic plan views of sub-pixels of the display device according to an embodiment of the present disclosure. FIGS. 4A and 4B are cross-sectional views taken along line IV-IV' of FIG. 3A. FIG. 5 is a perspective view of a light emitting element of the display device according to an embodiment of the present disclosure. FIG. 3A illustrates only the plurality of light emitting elements 130, a plurality of first lines 121, a plurality of second lines 122, and a plurality of third lines 123 among components of the sub-pixel SP, and FIG. 3B illustrates the plurality of light emitting elements 130, the plurality of first lines 121, the plurality of second lines 122, the plurality of third lines 123, and a connection electrode CE among components of the sub-pixel SP. In addition, in FIGS. 4A and 4B, only the driving transistor DT and the common line CL among components of the driving circuit are illustrated for convenience of explanation.

Referring to FIGS. 3A and 4A, a buffer layer 111 is disposed on the substrate 110. The buffer layer 111 may reduce penetration of moisture or impurities through the substrate 110. The buffer layer 111 may be formed of, for example, a single layer or multilayers of silicon oxide (SiOx) or silicon nitride (SiNx), but is not limited thereto. However, the buffer layer 111 may be omitted depending on a type of the substrate 110 or a type of the thin film transistor, but is not limited thereto.

The driving transistor DT is disposed on the buffer layer 111. The driving transistor DT includes an active layer ACT, a gate electrode GE, a source electrode SE, and a drain electrode DE.

First, the active layer ACT is disposed on the buffer layer 111. The active layer ACT may be formed of a semiconductor material such as an oxide semiconductor, amorphous silicon, or polysilicon, but is not limited thereto.

A gate insulating layer 112 is disposed on the active layer ACT. The gate insulating layer 112 is an insulating layer for insulating the active layer ACT and the gate electrode GE. The gate insulating layer 112 may be composed of a single layer or multilayers of silicon oxide (SiOx) or silicon nitride (SiNx), but is not limited thereto.

The gate electrode GE is disposed on the gate insulating layer 112. The gate electrode GE may be formed of a conductive material, for example, copper (Cu), aluminum (Al), molybdenum (Mo), nickel (Ni), titanium (Ti), chromium (Cr), or an alloy thereof, but is not limited thereto.

A first insulating layer 113 is disposed on the gate electrode GE. Contact holes for connecting each of the source electrode SE and the drain electrode DE to the active layer ACT are formed in the first insulating layer 113. The first insulating layer 113 is an insulating layer for protecting components under the first insulating layer 113, and may be composed of a single layer or multilayers of silicon oxide (Siox) or silicon nitride (SiNx), but is not limited thereto.

The source electrode SE and the drain electrode DE are disposed on the first insulating layer 113. Each of the source electrode SE and the drain electrode DE may be electrically connected to the active layer ACT through the contact holes formed in the first insulating layer 113. The source electrode SE and the drain electrode DE may be formed of a conductive material, for example, copper (Cu), aluminum (Al), molybdenum (Mo), nickel (Ni), titanium (Ti), chromium (Cr), or an alloy thereof, but are not limited thereto.

A gate connection electrode GEa and the common line CL are disposed on the first insulating layer 113. The gate connection electrode GEa is an electrode for connecting the gate electrode GE of the driving transistor DT and the switching transistor ST. The common line CL is a line that is connected to a second semiconductor layer 133 of the light emitting element 130 to drive the light emitting element 130. The gate connection electrode GEa and the common line CL may be formed of the same material as and formed in the same process as the source electrode SE and the drain electrode DE. For example, the gate connection electrode GEa and the common line CL may be formed of a conductive material such as copper (Cu), aluminum (Al), molybdenum (Mo), nickel (Ni), titanium (Ti), chromium (Cr), or an alloy thereof, but is not limited thereto. However, the gate connection electrode GEa may be omitted according to design, but is not limited thereto.

A second insulating layer 114 is disposed on the driving transistor DT, the gate connection electrode GEa, and the common line CL. The second insulating layer 114 is an insulating layer that protects components under the second insulating layer 114, and may be composed of a single layer or multiple layers of silicon oxide (Siox) or silicon nitride (SiNx), but is not limited thereto. Also, the second insulating layer 114 may function as a planarization layer that planarizes an upper portion of the driving transistor DT. In this case, the second insulating layer 114 may be composed of a single layer or multilayers, for example, may be formed of an acryl-based organic material, but is not limited thereto.

Referring to FIGS. 3A and 4A, the plurality of first lines 121, the plurality of second lines 122, a first connection line 121a, and a second connection line 122a are disposed on the second insulating layer 114.

The plurality of first lines 121 and the plurality of second lines 122 are lines that generate an electric field for self-aligning the plurality of light emitting elements 130 when the display device 100 is manufactured. The plurality of first lines 121 and the plurality of second lines 122 are lines that electrically connect the plurality of light emitting elements 130 and the driving transistor DT when the display device 100 is driven. The plurality of first lines 121 may be spaced apart from each other, and each of the plurality of second lines 122 may be disposed in a region between the plurality of first lines 121. That is, the plurality of first lines 121 and the plurality of second lines 122 may be alternately disposed. The plurality of first lines 121 and the plurality of second lines 122 may be alternately disposed in one sub-pixel SP.

Any one of the plurality of first lines 121 or the plurality of second lines 122 may be connected to the driving transistor DT through contact holes formed in the second insulating layer 114. For example, as shown in FIG. 4A, the plurality of first lines 121 may be directly connected to the drain electrode DE of the driving transistor DT, and the plurality of second lines 122 may be connected to the drain electrode DE of the driving transistor DT.

The plurality of first lines 121 and the plurality of second lines 122 may be formed of a conductive material, for example, copper (Cu), chromium (Cr), molybdenum (Mo), molybdenum titanium (MoTi), or the like, but is not limited thereto.

Each of the plurality of first lines 121 may be electrically connected to each other by the first connection line 121a. Each of the plurality of second lines 122 may be electrically connected to each other by the second connection line 122a. For example, the plurality of first lines 121 may extend in a column direction, and the first connection line 121a may extend in a row direction and be connected to the plurality of first lines 121. The plurality of second lines 122 may extend in the column direction, and the second connection line 122a may extend in the row direction and be connected to the plurality of second lines 122.

A third insulating layer 115 is disposed on the plurality of first lines 121 and the plurality of second lines 122. The third insulating layer 115 is an insulating layer that protects components under the third insulating layer 115. In addition, the third insulating layer 115 may function as an insulating layer that prevents short-circuit defects due to migration between the plurality of first lines 121 and the plurality of second lines 122 when the display device 100 is manufactured. It may be formed of a single layer or multilayers of silicon oxide (SiOx) or silicon nitride (SiNx), but is not limited thereto.

Referring to FIGS. 3A, 4A and 5 together, the plurality of light emitting elements 130 are disposed on the third insulating layer 115. Each of the plurality of light emitting elements 130 is disposed in spaces between the plurality of first lines 121 and the plurality of second lines 122. Any one of both ends of the plurality of light emitting elements 130 may be arranged toward the plurality of first lines 121, and the other ends thereof may be arranged toward the plurality of second lines 122. For example, each of the plurality of light emitting elements 130 may be disposed so that both ends thereof overlap the plurality of first lines 121 and the plurality of second lines 122. In addition, the plurality of light emitting elements 130 may be disposed in two cases according to alignment directions so that one ends thereof overlap the plurality of first lines 121 and the other ends thereof overlap the plurality of second lines 122 in one case, and one ends thereof overlap the plurality of second lines 122 and the other ends thereof overlap the plurality of first lines 121 in the other case.

When self-aligning the plurality of light emitting elements 130, the alignment directions of the light emitting elements 130 may vary in a process of aligning both ends of each of the plurality of light emitting elements 130 toward the first lines 121 and the second lines 122, and a self-alignment process of the light emitting elements 130 will be described later with reference to FIGS. 7A to 7E.

In some light emitting elements 130 among the plurality of light emitting elements 130, first semiconductor layers 131 are arranged toward the plurality of first lines 121, and in other some light emitting elements 130, the first semiconductor layers 131 may be arranged toward the plurality of second lines 122.

Each of the plurality of light emitting elements 130 includes the first semiconductor layer 131, a light emitting layer 132, the second semiconductor layer 133, a conductor layer 134, and a non-conductor layer 135. These components may be arranged sequentially and/or linearly in each of the plurality of light emitting elements 130. A first side of the first semiconductor layer 131 may be at a first end of a light emitting element 130 and a second side of the first semiconductor layer 131 opposite to the first side of the first semiconductor layer 131 may be adjacent to the light emitting layer 132. A first side of the light emitting layer 132 may be adjacent to the first semiconductor layer 131 and a second side of the light emitting layer 132 opposite to the first side of the light emitting layer 132 may be adjacent to the second semiconductor layer 133. A first side of the second semiconductor layer 133 may be adjacent to the light emitting layer 132 and a second side of the second semiconductor layer 133 opposite to the first side of the second semiconductor layer 133 may be adjacent to the conductor layer 134. A first side of the conductor layer 134 may be adjacent to the second semiconductor layer 133 and a second side of the conductor layer 134 opposite to the first side of the conductor layer 134 may be adjacent to the non-conductor layer 135. A first side of the non-conductor layer 135 may be adjacent to the conductor layer 134 and a second side of the non-conductor layer 135 opposite to the first side of the non-conductor layer 135 may be at a second end of the light emitting element 130.

The second semiconductor layer 133 is disposed at one side of the first semiconductor layer 131. The first semiconductor layer 131 and the second semiconductor layer 133 may be layers that are formed by doping a specific material with n-type impurities and p-type impurities. For example, the first semiconductor layer 131 and the second semiconductor layer 133 may be layers in which a material such as gallium nitride (GaN), indium aluminum phosphide (InAlP), or gallium arsenide (GaAs) is doped with p-type impurities or n-type impurities. In addition, the p-type impurities may be magnesium (Mg), zinc (Zn), beryllium (Be), and the like, and the n-type impurities may be silicon (Si), germanium (Ge), tin (Sn) and the like, but they are not limited thereto.

The light emitting layer 132 is disposed between the first semiconductor layer 131 and the second semiconductor layer 133. The light emitting layer 132 may receive holes and electrons from the first semiconductor layer 131 and the second semiconductor layer 133 and emit light. The light emitting layer 132 may have a single-layer structure or multi-quantum well (MQW) structure, for example, may be formed of indium gallium nitride (InGaN), gallium nitride (GaN) or the like, but is not limited thereto.

The conductor layer 134 is disposed at one side of the second semiconductor layer 133. The conductor layer 134 is a component to electrically connect the second semiconductor layer 133 and the plurality of third lines 123 to be described later, and may be formed of a conductive material. For example, the conductor layer 134 may be formed of a gold alloy such as nickel gold or titanium gold, but is not limited thereto.

The non-conductor layer 135 is disposed at one side of the conductor layer 134. The non-conductor layer 135 may be formed of an insulating material, for example, silicon oxide (SiO$_2$), but is not limited thereto. The non-conductor layer 135 is a kind of dummy layer which is disposed to connect the light emitting elements 130 and the driving transistor DT regardless of the alignment directions of the plurality of light emitting elements 130.

Specifically, a general LED has a structure in which a first semiconductor layer is disposed at one end thereof and a second semiconductor layer is disposed at the other end thereof. In this case, when the connection electrode CE is connected to both ends of the light emitting element 130, both the first semiconductor layer and the second semiconductor layer are connected to the connection electrode CE, thereby causing a defect.

However, in the display device 100 according to an embodiment of the present disclosure, the non-conductor layer 135 is formed at one end of the light emitting element 130, so even if the connection electrode CE to be described later is formed on both ends of the light emitting element 130, no short-circuit defect occurs. In addition, the first semiconductor layer 131 of the light emitting element 130 is electrically connected to the driving transistor DT and the second semiconductor layer 133 of the light emitting element 130 is electrically connected to the common line CL regardless of the alignment directions of both ends of the light emitting element 130, so that the light emitting element 130 may be normally driven. This will be described later with reference to FIGS. 7A to 7E.

Referring to FIG. 5, a thickness T2 of the non-conductor layer 135 may be similar or identical to a sum T1 of a thickness of the first semiconductor layer 131, a thickness of the light emitting layer 132, and a thickness of the second semiconductor layer 133. As the thickness T2 of the non-conductor layer 135 is configured on a level that is similar to the sum T1 of the thickness of the first semiconductor layer 131, the thickness of the light emitting layer 132, and the thickness of the second semiconductor layer 133, the conductor layer 134 disposed between the non-conductor layer 135 and the second semiconductor layer 133 may be disposed in a central portion of the light emitting element 130. The conductor layer 134 in contact with the second semiconductor layer 133 is disposed in the central portion of the light emitting element 130, so that the second semiconductor layer 133 of the light emitting element 130 may be easily connected to the plurality of third lines 123, which will be described later.

Referring to FIGS. 3B and 4A together, the connection electrode CE is disposed on the plurality of light emitting elements 130. The connection electrode CE is disposed to cover both ends of each of the plurality of light emitting elements 130. In addition, the connection electrode CE may be electrically connected to the plurality of first lines 121 and the plurality of second lines 122 through contact holes formed in the third insulating layer 115. Accordingly, each of the plurality of light emitting elements 130 may be electrically connected to the plurality of first lines 121 and the plurality of second lines 122 and the drain electrode DE of the driving transistor DT through the connection electrode CE.

The connection electrode CE may be electrically connected to both the plurality of first lines 121 and the plurality of second lines 122 disposed in one sub-pixel SP. Accordingly, both the plurality of first lines 121 and the plurality of second lines 122 disposed in one sub-pixel SP may be electrically connected to the driving transistor DT and the plurality of light emitting elements 130. For example, the plurality of first lines 121 that are electrically connected to the driving transistor DT may be electrically connected to the plurality of second lines 122 through the connection electrode CE.

The connection electrode CE covers the both ends of each of the plurality of light emitting elements 130. The connection electrode CE is disposed to cover the first semiconductor layers 131 and the non-conductor layers 135 disposed at both ends of the plurality of light emitting elements 130. In addition, the first semiconductor layer 131 may be electrically connected to the plurality of first lines 121, the plurality of second lines 122, and the driving transistor DT through the connection electrode CE. However, since the non-conductor layer 135 that is covered with the connection electrode CE is formed of an insulating material, the conductor layer 134 that is adjacent to the non-conductor layer 135 and the second semiconductor layer 133 that is adjacent to the conductor layer 134 may be electrically insulated from the connection electrode CE. Accordingly, the connection electrode CE is disposed to be in contact with the both ends of the plurality of light emitting elements 130, but only the first semiconductor layers 131 of each of the plurality of light emitting elements 130 may be electrically connected to the plurality of first lines 121, the plurality of second lines 122, and the driving transistor DT through the connection electrode CE.

Finally, the plurality of third lines 123 are disposed on the plurality of light emitting elements 130. The plurality of third lines 123 are lines electrically connecting the second semiconductor layers 133 of the plurality of light emitting elements 130 and the common line CL. The plurality of third lines 123 are disposed between each of the plurality of first lines 121 and the plurality of second lines 122 to cover the central portions of the plurality of light emitting elements 130. For example, when the plurality of first lines 121 and the plurality of second lines 122 that are alternately disposed extend in the column direction, the plurality of third lines 123 may be disposed to extend in the column direction in regions between the plurality of first lines 121 and the plurality of second lines 122.

The plurality of third lines 123 may be in contact with the conductor layers 134 disposed at the central portions of the plurality of light emitting elements 130. The plurality of third lines 123 may be electrically connected to the conductor layers 134 and the second semiconductor layers 133 adjacent to the conductor layers 134. For example, the plurality of third lines 123 may come in contact with the conductor layers 134 disposed at the central portions of the plurality of light emitting elements 130, and at the same time, may be in contact with one portions of the non-conductor layers 135 adjacent to the conductor layers 134 or one portions of the second semiconductor layers 133 adjacent to the conductor layers 134.

In this case, the plurality of third lines 123 may be disposed to be spaced apart from the connection electrode CE of the both ends of the plurality of light emitting elements 130. When the plurality of third lines 123 come in contact with the connection electrode CE that is electrically connected to the first semiconductor layer 131 and the driving transistor DT, a short-circuit defect may occur, so that the plurality of third lines 123 may be disposed to be spaced apart from the connection electrode CE.

In addition, each of the plurality of third lines 123 may be electrically connected to the common line CL through contact holes formed in the third insulating layer 115 and the second insulating layer 114. Accordingly, the common line CL and the second semiconductor layers 133 of the plurality of light emitting elements 130 may be electrically connected to each other through the plurality of third lines 123 and the conductor layers 134.

Meanwhile, a case in which the plurality of third lines 123 are formed to be in contact with the first semiconductor layers 131 may occur due to a process error or the like. In this case, the plurality of third lines 123 may come in contact with both the first semiconductor layers 131 and the second semiconductor layers 133 of the light emitting elements 130, so that a short-circuit defect may occur. To prevent this, after an additional insulating layer is formed on the plurality of light emitting elements 130, the plurality of third lines 123 may be formed.

Specifically, referring to FIG. 4B, a fourth insulating layer 116 is disposed as an additional insulating layer on the plurality of light emitting elements 130 and the connection electrode CE. The fourth insulating layer 116 may cover at least the first semiconductor layers 131 and the light emitting layers 132 among the plurality of light emitting elements 130. In addition, the fourth insulating layer 116 includes contact holes that expose the central portions of each of the plurality of light emitting elements 130. The conductor layers 134 that are positioned at the central portions of the plurality of light emitting elements 130 may be exposed through the contact holes of the fourth insulating layer 116, and in some cases, the second semiconductor layers 133 and the non-conductor layers 135 adjacent to the conductor layers 134 may be exposed from the fourth insulating layer 116.

In addition, the plurality of third lines 123 are disposed on the fourth insulating layer 116. The plurality of third lines 123 may be electrically connected to the plurality of light emitting elements 130 through the contact holes in the fourth insulating layer 116. At this time, the plurality of third lines 123 are not in contact with the first semiconductor layers 131 of the plurality of light emitting elements 130 by the fourth insulating layer 116. The plurality of third lines 123 may be in contact with only the conductor layers 134 and the non-conductor layers 135 adjacent to the conductor layers 134 or the second semiconductor layers 133 of the plurality of light emitting elements 130. However, the fourth insulating layer 116 may be omitted according to design, but is not limited thereto.

Hereinafter, a process of manufacturing the plurality of light emitting elements 130 and the display device 100 will be described with reference to FIGS. 6A to 7E.

Figure 6A:
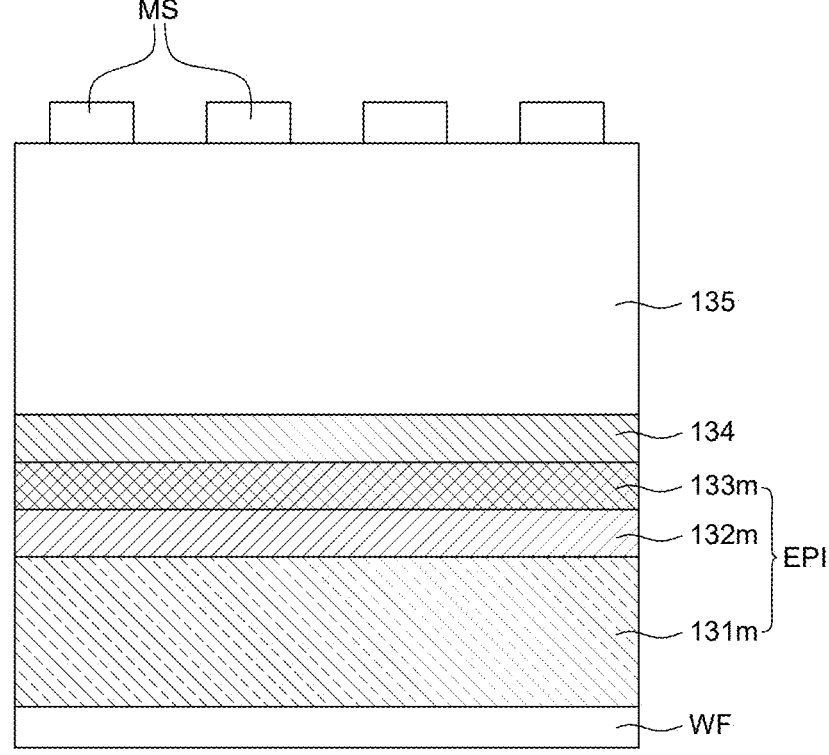
FIGS. 6A to 6C are process views illustrating a method of manufacturing the light emitting element of the display device according to an embodiment of the present disclosure.
Figure 6B:
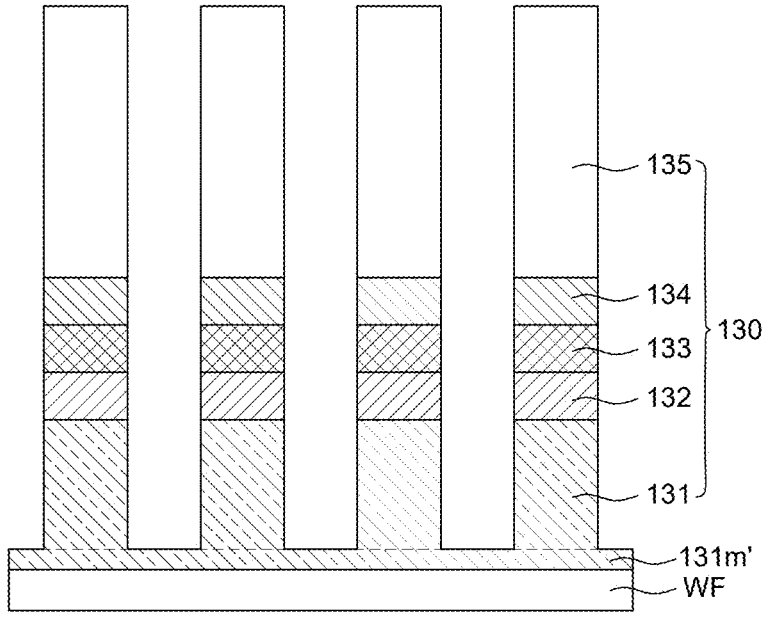
Figure 6C:
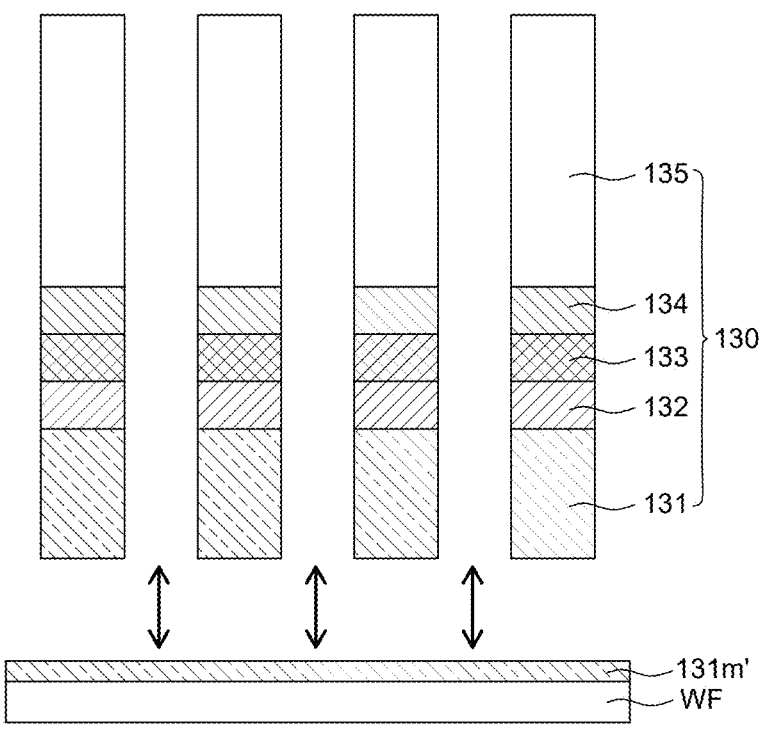

FIGS. 6A to 6C are process views illustrating a method of manufacturing the light emitting element of the display device according to an embodiment of the present disclosure. FIGS. 7A to 7E are process views illustrating a method of manufacturing the display device according to an embodiment of the present disclosure.

Referring to FIG. 6A, an epitaxial layer EPI is formed on a growth substrate WF. The epitaxial layer EPI is a layer formed on the growth substrate WF to form the plurality of light emitting elements 130. The epitaxial layer EPI may have a structure in which a first semiconductor material layer 131*m* for forming the first semiconductor layer 131, a light emitting material layer 132*m* for forming the light emitting layer 132, and a second semiconductor material layer 133*m* for forming the second semiconductor layer 133 may be sequentially stacked.

Specifically, the first semiconductor material layer 131*m* may be formed by growing a semiconductor crystal on the growth substrate WF. In addition, the light emitting material layer 132*m* and the second semiconductor material layer 133*m* may be sequentially formed by growing a semiconductor crystal on the first semiconductor material layer 131*m*. In this case, the light emitting material layer 132*m* grow may by inheriting crystallinity of the first semiconductor material layer 131*m*. The second semiconductor material layer 133*m* may grow by inheriting crystallinity of the light emitting material layer 132*m*. Accordingly, the epitaxial layer EPI may be formed by forming the first semiconductor material layer 131*m*, the light emitting material layer 132*m*, and the second semiconductor material layer 133*m* on the growth substrate WF.

The epitaxial layer EPI may be grown on the growth substrate WF by a method such as metal organic chemical vapor deposition (MOCVD) or sputtering, but a growth method of the epitaxial layer EPI is not limited thereto.

Next, the conductor layer 134 and the non-conductor layer 135 are formed on an entire surface of the growth substrate WF on the epitaxial layer EPI. The conductor layer 134 may be formed by forming a conductive material on the epitaxial layer EPI, and the non-conductor layer 135 may be formed by forming an insulating material on the conductor layer 134.

Next, a mask MS is formed on the non-conductor layer 135. The mask MS is a configuration to form the plurality of light emitting elements 130 by patterning the epitaxial layer EPI, the conductor layer 134, and the non-conductor layer 135. A portion of the epitaxial layer EPI, a portion of the conductor layer 134, and a portion of the non-conductor layer 135 that do not overlap the mask MS, are patterned, so that only a portion of the epitaxial layer EPI, a portion of the conductor layer 134, and a portion of the non-conductor layer 135 that overlap the mask MS may remain on the growth substrate WF.

In this case, a portion of a first semiconductor material layer 131*m*' that is at a lower portion adjacent to the growth substrate WF may remain on the growth substrate WF without being patterned. A portion of the first semiconductor material layer 131*m*' adjacent to the growth substrate WF may remain without being patterned, in that a thickness of the first semiconductor material layer 131*m* is greater than that of the second semiconductor material layer 133*m* or the light emitting material layer 132*m*. However, according to a process, the first semiconductor material layer 131*m* that does not overlap the mask MS may all be patterned, so that the growth substrate WF may be exposed, but the present disclosure is not limited thereto.

Next, referring to FIGS. 6B and 6C, when formation of the light emitting elements 130 are completed, the mask MS is removed and the plurality of light emitting elements 130 are separated from the growth substrate WF. For example, the growth substrate WF and the plurality of light emitting elements 130 may be separated through a laser lift off (LLO) technology. In the case of the laser lift off technology, when a laser is irradiated onto the growth substrate WF, laser absorption occurs at an interface between the first semiconductor material layer 131*m*' and the growth substrate WF, so that the first semiconductor material layer 131*m*' and the growth substrate WF of each of the plurality of light emitting elements 130 may be separated from each other. However, the growth substrate WF and the plurality of light emitting elements 130 may be separated using a method other than a laser lift off (LLO) method, for example, a chemical lift off (CLO) technology or a stamp or the like, but the present disclosure is not limited thereto.

Hereinafter, a process of manufacturing the display device 100 by self-aligning the light emitting element 130 on the substrate 110 will be described with reference to FIGS. 7A to 7E.

Figure 7A:
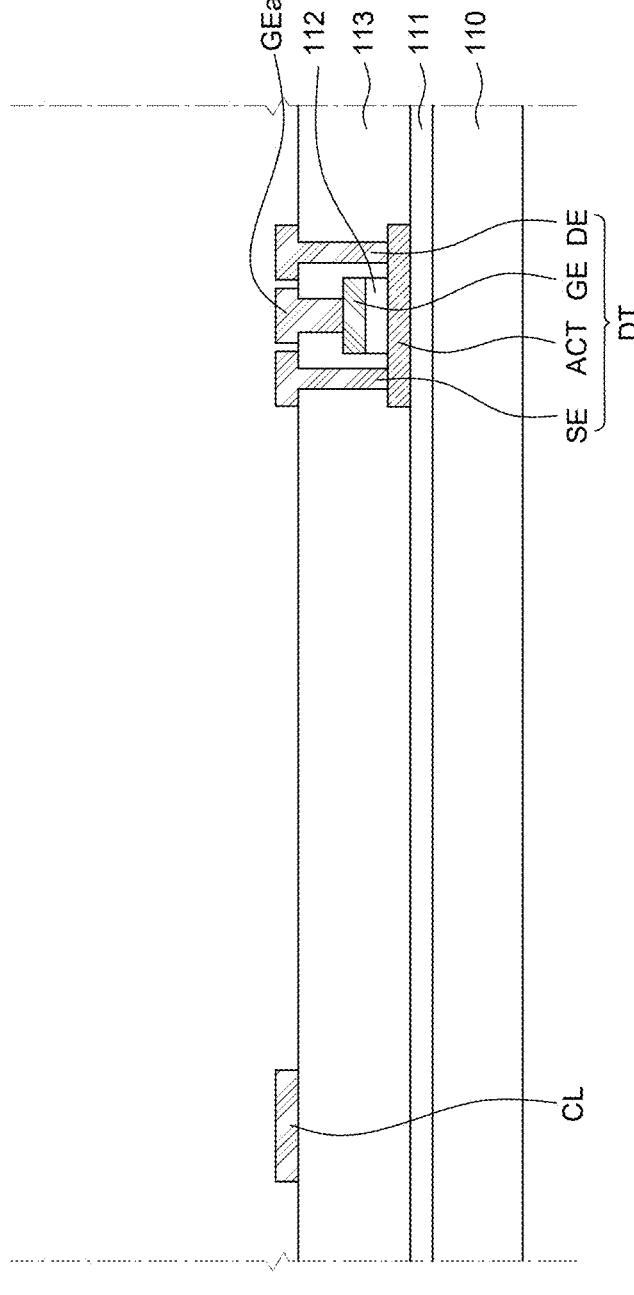
FIGS. 7A to 7E are process views illustrating a method of manufacturing the display device according to an embodiment of the present disclosure.

Referring to FIG. 7A, the buffer layer 111 is formed on the substrate 110. The buffer layer 111 that covers the substrate 110 may be formed so that moisture or impurities from the substrate 110 do not diffuse into the display device 100.

Next, the driving transistor DT is formed on the buffer layer 111. Specifically, the active layer ACT may be formed on the buffer layer 111, and the gate insulating layer 112 and the gate electrode GE may be sequentially formed on the active layer ACT.

Next, the first insulating layer 113 that covers the active layer ACT, the gate insulating layer 112 and the gate electrode GE is formed.

In addition, the source electrode SE, the drain electrode DE, the gate connection electrode GEa, and the common line CL may be formed on the first insulating layer 113. The source electrode SE, the drain electrode DE, the gate connection electrode GEa, and the common line CL may be formed of the same material and formed simultaneously. Accordingly, the formation of the driving transistor DT may be completed.

Figure 7B:
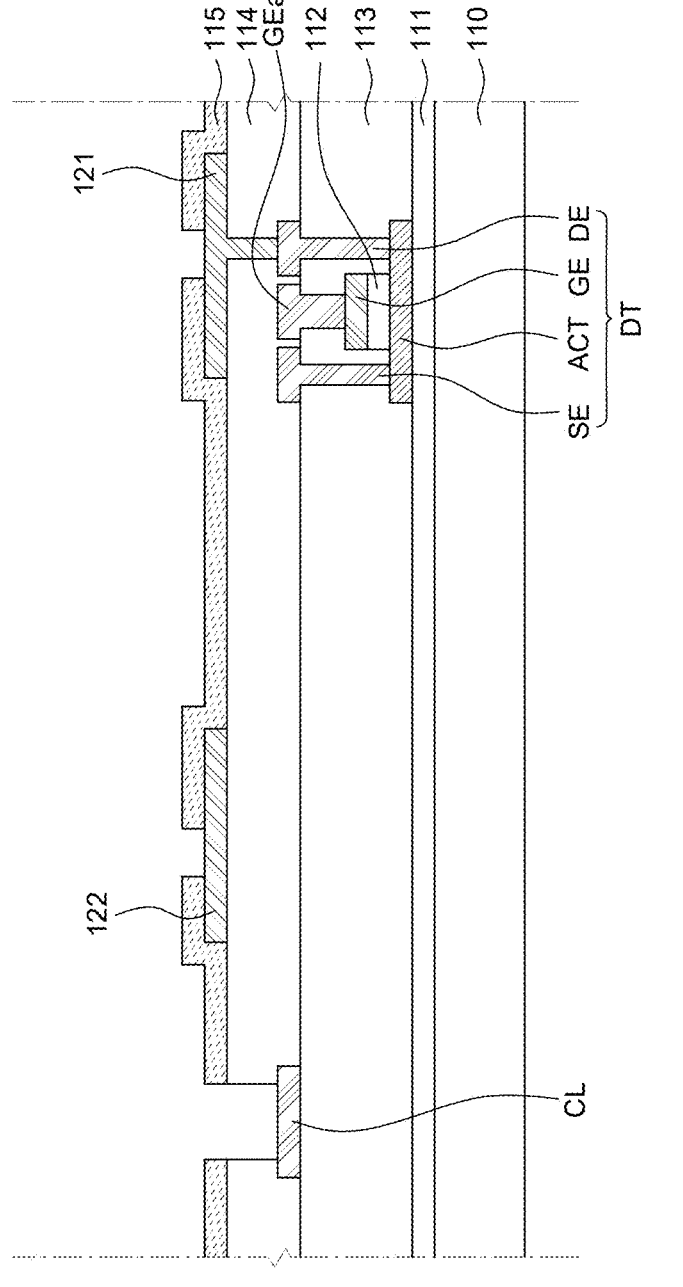

Next, referring to FIG. 7B, the second insulating layer 114 is formed on the driving transistor DT and the common line CL. And the plurality of first lines 121, the plurality of second lines 122, the first connection line 121a, and the second connection line 122a are formed on the second insulating layer 114. The plurality of first lines 121 that are disposed to be spaced apart from each other and the first connection line 121a that connects the plurality of first lines 121 may be formed. At the same time, the plurality of second lines 122 may be formed between the plurality of first lines 121, and the second connection line 122a that connects the plurality of second lines 122 to each other may be formed.

Next, the third insulating layer 115 is formed on the plurality of first lines 121, the plurality of second lines 122, the first connection line 121a, and the second connection line 122a. A material constituting the third insulating layer 115 is formed on an entire surface of the substrate 110, and contact holes that expose a portion of the plurality of first lines 121, a portion of the plurality of second lines 122 and a portion of the common line CL are formed therein, so that the third insulating layer 115 may be formed.

Figure 7C:
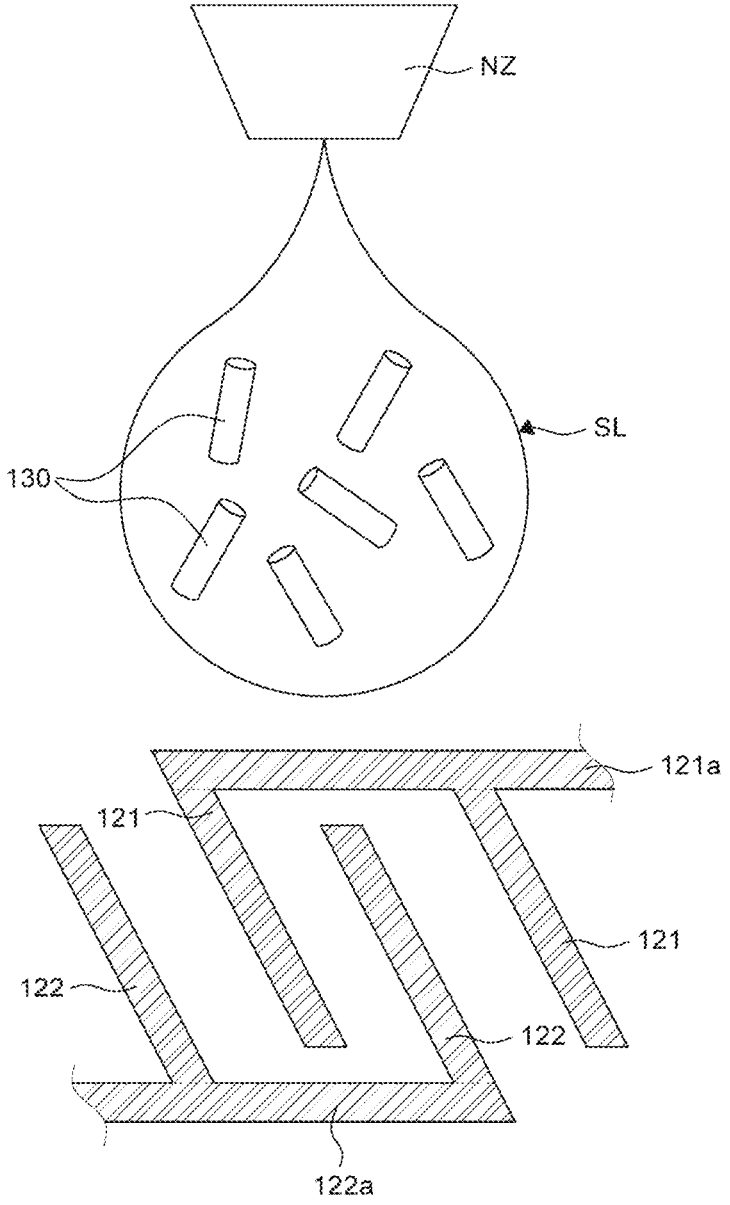

Then, referring to FIG. 7C, a solution SL in which the plurality of light emitting elements 130 are dispersed is applied to the substrate 110 on which the plurality of first lines 121 and the plurality of second lines 122 are formed, using a nozzle NZ. In addition, the plurality of light emitting elements 130 may be self-aligned by applying a voltage to the plurality of first lines 121 and the plurality of second lines 122.

Figure 7D:
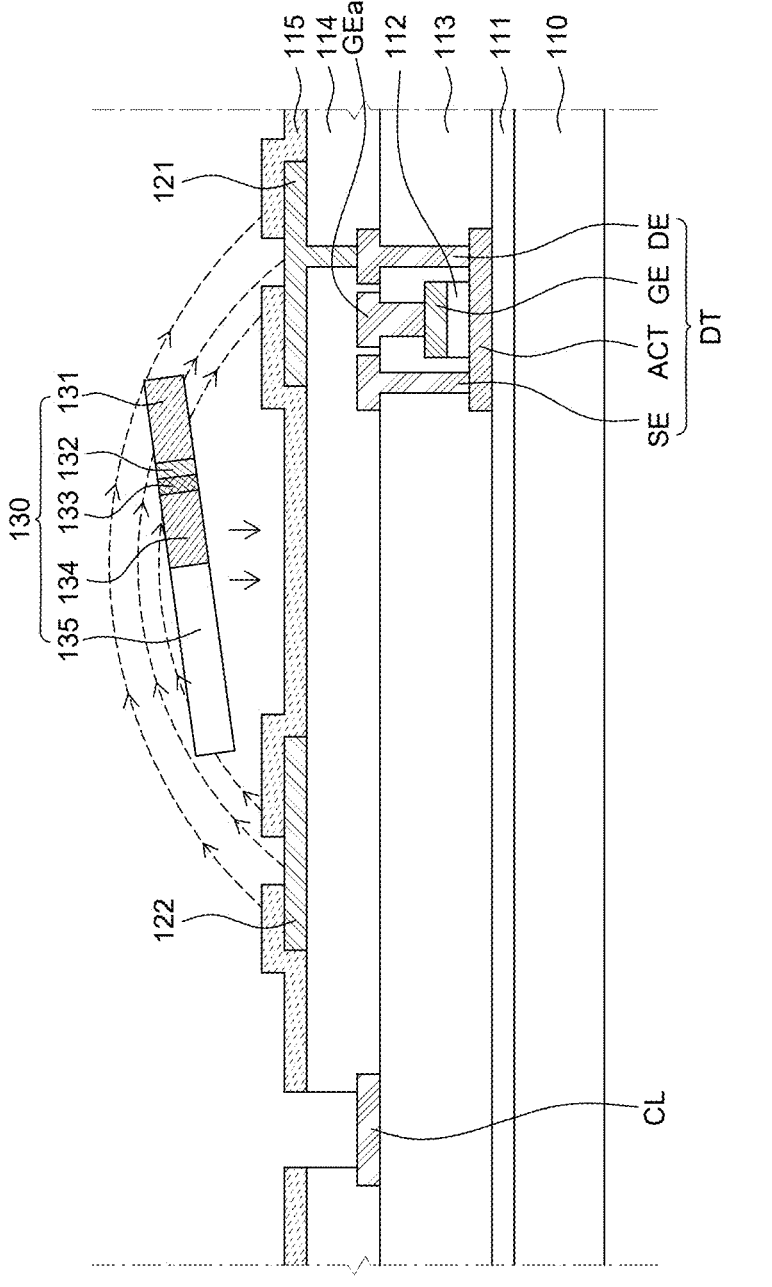

Specifically, referring to FIG. 7D, an electric field may be formed by applying an alternating voltage (AC) to the plurality of first lines 121 and the plurality of second lines 122. By this electric field, the light emitting elements 130 may be dielectrically polarized and have a polarity. In addition, the dielectrically polarized light emitting elements 130 may be moved or fixed in specific directions by dielectrophoresis (DEP), that is, an electric field. Accordingly, the plurality of light emitting elements 130 may be aligned and fixed between the plurality of first lines 121 and the plurality of second lines 122 using dielectrophoresis.

Specifically, in some light emitting elements 130 among the plurality of light emitting elements 130, one ends thereof may be aligned toward the plurality of first lines 121, and the other ends thereof may be aligned toward the second lines 122 adjacent to first lines 121. In addition, in other some light emitting elements 130, one ends thereof may be aligned toward the plurality of second lines 122, and the other ends thereof may be aligned toward the first lines 121 adjacent to the second lines 122. For example, in some light emitting elements 130, the first semiconductor layers 131 may be aligned toward the first lines 121, and the non-conductor layers 135 may be aligned toward the second lines 122. In other some light emitting elements 130, the first semiconductor layers 131 may be aligned toward the second lines 122, and the non-conductor layers 135 may be aligned toward the first lines 121.

At this time, when an electric field for aligning the light emitting elements 130 is formed, different voltages may be easily applied to the plurality of first lines 121 and the plurality of second lines 122 using the first connection line 121a connecting the plurality of first lines 121 and the second connection line 122a connecting the plurality of second lines 122. For example, although not shown in the drawings, each of the first connection line 121a and the second connection line 122a may extend to the non-display area NA during the process of manufacturing the display device 100, and an electric field may be formed by transferring a voltage from the outside to each of the plurality of first lines 121 and the plurality of second lines 122 of the plurality of sub-pixels SP. Accordingly, an electric field that aligns the plurality of light emitting elements 130 may be formed by applying different voltages to the plurality of first lines 121 and the plurality of second lines 122.

However, in this specification, although it is described that the plurality of first lines 121 and the plurality of second lines 122 are connected to the first connection line 121a and the second connection line 122a, respectively, each of the plurality of first lines 121 and the plurality of second lines 122 may extend to the non-display area NA without the first connection line 121a and the second connection line 122a and receive a voltage applied thereto. Therefore, a voltage application method for forming an electric field between the plurality of first lines 121 and the plurality of second lines 122 is not limited thereto.

Figure 7E:
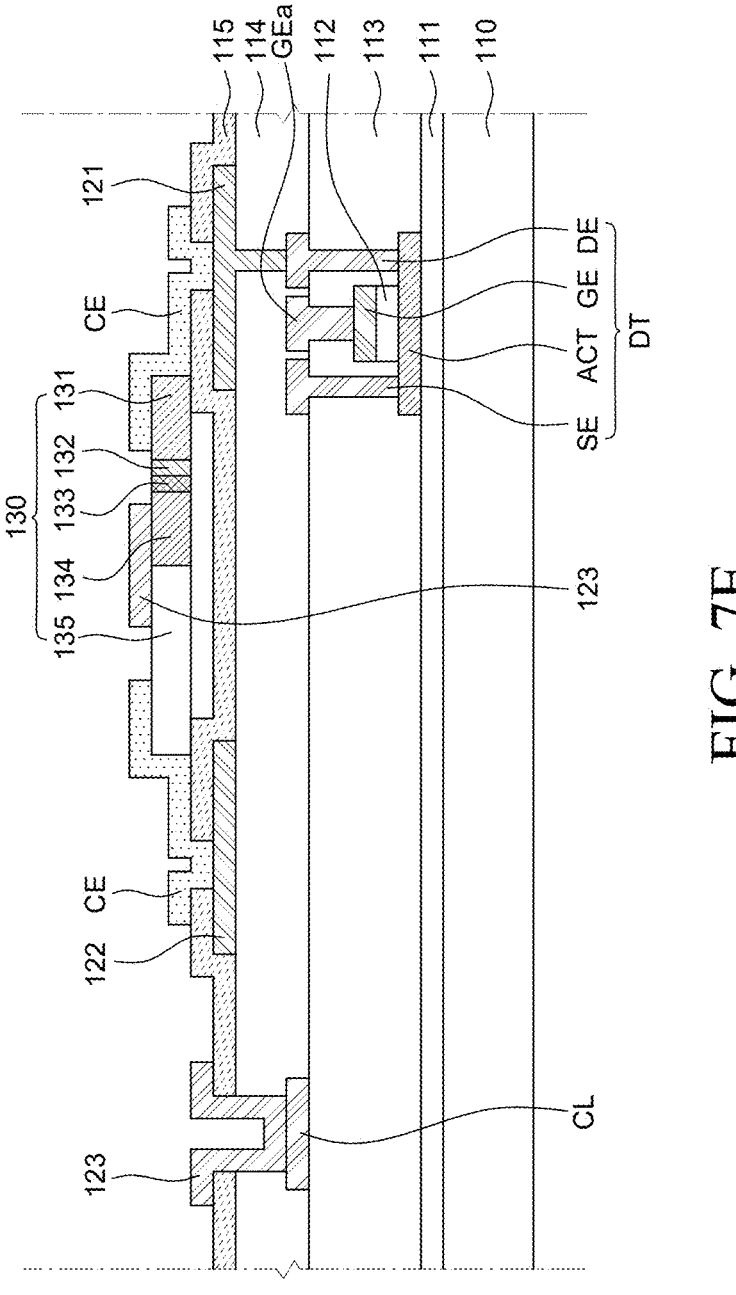

Next, referring to FIG. 7E, after self-aligning of the plurality of light emitting elements 130 is completed, the connection electrode CE may be formed to be in contact with the both ends of the plurality of light emitting elements 130, the plurality of first lines 121, and the plurality of second lines 122. The connection electrode CE may be formed to be in contact with the first semiconductor layers 131 and the non-conductor layers 135 at the both ends of the plurality of light emitting elements 130. In this case, the plurality of light emitting elements 130, the plurality of first lines 121, the plurality of second lines 122, and the driving transistor DT may be electrically connected through the connection electrode CE in contact with the first semiconductor layers 131.

Next, the plurality of third lines 123 connecting the central portions of the plurality of light emitting elements 130 and the common line CL are formed. The plurality of third lines 123 may be formed between the plurality of first lines 121 and the plurality of second lines 122 to be in contact with the central portions of the plurality of light emitting elements 130. The plurality of third lines 123 may be in contact with the conductor layers 134 that are positioned at the central portions of the plurality of light emitting elements 130, and according to process design, may be formed to be in contact with the second semiconductor layers 133 adjacent to the conductor layers 134 and the non-conductor layers 135. Therefore, the plurality of third lines 123 may be electrically connected to the second semiconductor layers 133 through the conductor layers 134.

In addition, the plurality of third lines 123 may be formed to be in contact with the common line CL that is exposed in the contact holes formed in the third insulating layer 115 and the second insulating layer 114. Accordingly, the second semiconductor layers 133 of the plurality of light emitting elements 130 and the common line CL may be electrically connected to each other through the plurality of third lines 123.

Accordingly, in the display device 100 and a method of manufacturing the display device 100 according to an embodiment of the present disclosure, the plurality of first lines 121 and the plurality of second lines 122 for aligning the plurality of light emitting elements 130 are formed on the substrate 110 on which the driving transistor DT is formed, and the plurality of light emitting elements 130 may be self-aligned. Specifically, an electric field may be formed on the substrate 110 by applying an AC voltage to the plurality of first lines 121 and the plurality of second lines 122. In addition, the plurality of light emitting elements 130 that are applied to the substrate 110 may be self-aligned on the plurality of first lines 121 and the plurality of second lines 122 by an electric field between the plurality of first lines 121 and the plurality of second lines 122. Therefore, a transfer process of aligning and transferring the plurality of light emitting elements 130 at specific positions may be simplified. In addition, the connection electrode CE and the plurality of third lines 123 are formed on the plurality of self-aligned light emitting elements 130, so that the plurality of light emitting elements 130 may be easily connected to the driving transistor DT and the common line CL and the plurality of light emitting elements 130 can be driven. Accordingly, in the display device 100 and the method of manufacturing the display device 100 according to an embodiment of the present disclosure, the plurality of light emitting elements 130 are self-aligned at specific positions on the substrate 110, so that a transfer process of the plurality of light emitting elements 130 may be simplified and a manufacturing cost may be reduced.

In the display device 100 and the method of manufacturing the display device 100 according to an embodiment of the present disclosure, the plurality of light emitting elements 130 are applied to the plurality of first lines 121 and the plurality of second lines 122 that form electric fields, so that they may be self-aligned. In this case, in a process in which the both ends of the plurality of light emitting elements 130 are aligned toward each of the first lines 121 and the second lines 122, the first semiconductor layers 131 may be aligned toward the first lines 121 or the first semiconductor layers 131 may be aligned toward the second lines 122. If the first line 121 is used only as a line applying a voltage to the first semiconductor layer 131, and the second line 122 is used only as a line applying a voltage to the second semiconductor layer 133, the plurality of light emitting elements 130 in which the second semiconductor layers 133 are aligned toward the first lines 121 may have difficulty in line connection and may be difficult to be driven normally.

Accordingly, in the display device 100 and the method of manufacturing the display device 100 according to an embodiment of the present disclosure, by forming the conductor layers 134 and the non-conductor layers 135 at one sides of the second semiconductor layers 133 of the plurality of light emitting elements 130, the plurality of light emitting elements 130 and the driving circuit may be connected without limitation to alignment directions of the plurality of light emitting elements 130. First, the first semiconductor layers 131 and the non-conductor layers 135 are disposed at the both ends of the light emitting elements 130. And, by forming the connection electrode CE on the both ends of the light emitting element 130, the first semiconductor layer 131 of the light emitting element 130, the plurality of first lines 121, the plurality of second lines 122, and the driving transistor DT may be electrically connected to each other. Since the connection electrode CE is formed on the both ends of the light emitting element 130, the first semiconductor layer 131 and the driving transistor DT may be electrically connected to each other without limitation to the alignment direction of the first semiconductor layer 131. In addition, the plurality of third lines 123 that cover the central portions of each of the plurality of light emitting elements 130 may be formed to thereby electrically connect the second semiconductor layers 133 and the common line CL. At this time, since the non-conductor layer 135 is disposed at one end of the light emitting element 130, even when the connecting electrode CE that covers the non-conductor layer 135 is formed, the connecting electrode CE and the second semiconductor layer 133 may be electrically insulated from each other. In addition, since the non-conductor layer 135 is disposed at one side of the second semiconductor layer 133, the second semiconductor layer 133 of the light emitting element 130 and the conductor layer 134 may be disposed at the central portion of the light emitting element 130, and the second semiconductor layers 133 and the plurality of third lines 123 may be easily connected. In addition, since the conductor layer 134 is disposed between the second semiconductor layer 133 and the non-conductor layer 135, elec- trical connections between the plurality of third lines 123 and the second semiconductor layers 133 may be more facilitated. Accordingly, in the display device 100 according to an embodiment of the present disclosure, the connection electrode CE is connected to the both ends of the plurality of light emitting elements 130 that are self-aligned, and the plurality of third lines 123 are connected to the central portions of the plurality of light emitting elements 130, so that the light emitting elements 130 and the driving circuit may be connected without limitation to the alignment direc- tions of the light emitting elements 130. Thus, an assembly rate of the light emitting elements 130 can be improved and a manufacturing cost can be reduced. In addition, the number of light emitting elements 130 that are assembled to each of the plurality of sub-pixels SP increases, so that high luminance of light may be implemented.

Figure 8:
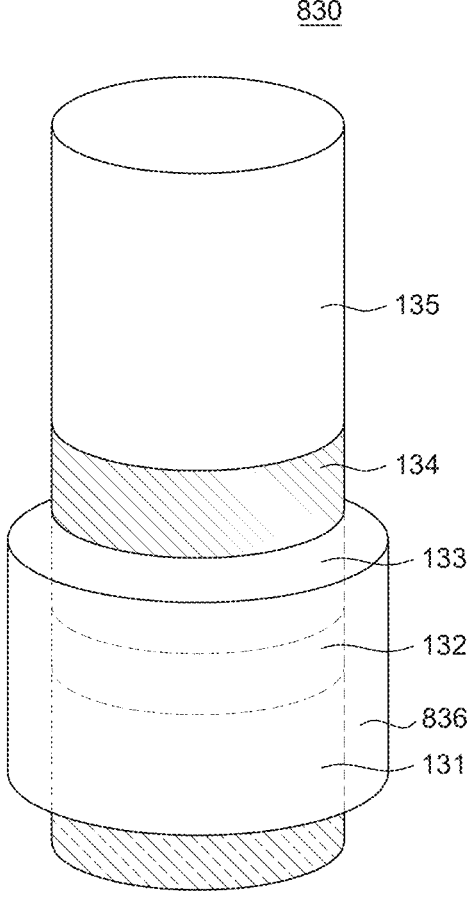
FIG. 8 is a perspective view of a light emitting element of a display device according to another embodiment of the present disclosure.
Figure 9:
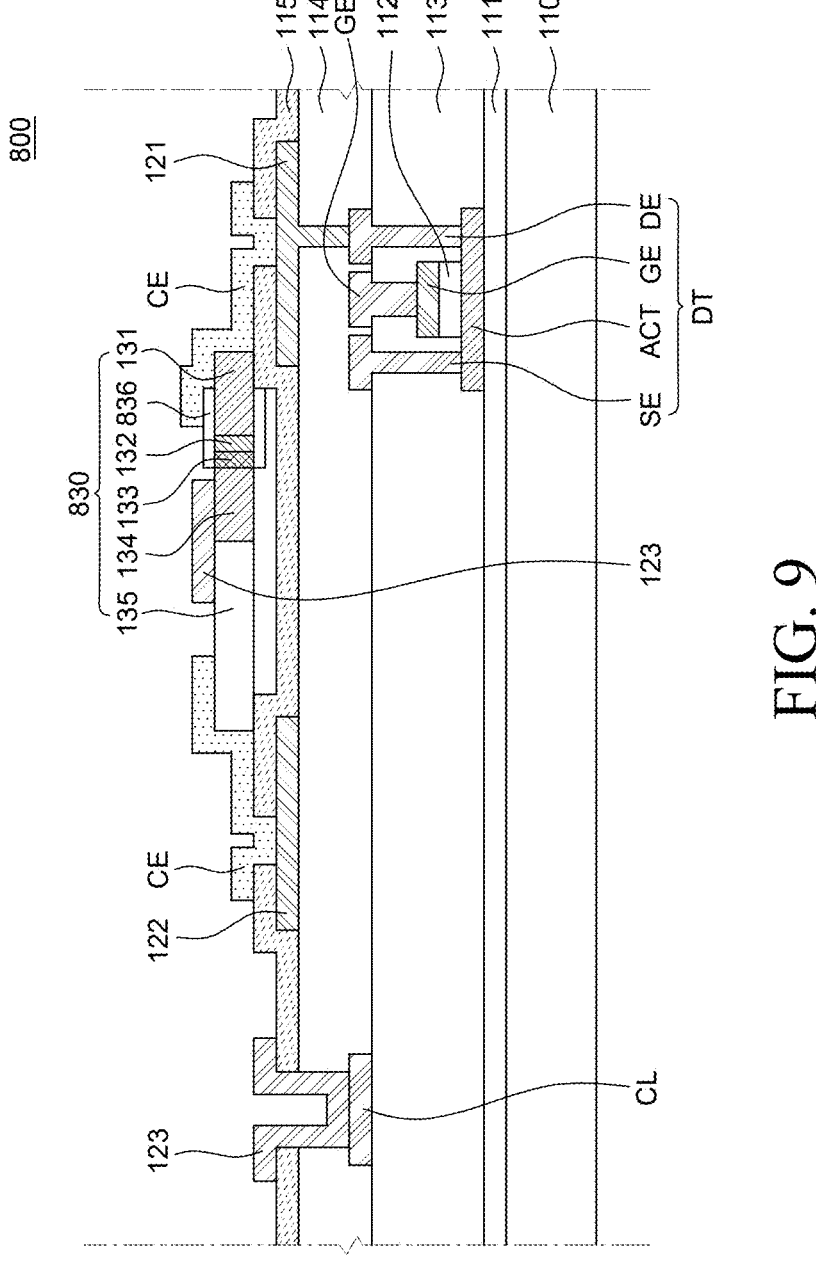
FIG. 9 is a cross-sectional view of the display device according to another embodiment of the present disclosure.

FIG. 8 is a perspective view of a light emitting element of a display device according to another embodiment of the present disclosure. FIG. 9 is a cross-sectional view of the display device according to another embodiment of the present disclosure. Compared to the display device 100 of FIGS. 1 to 7E, in a display device 800 of FIGS. 8 and 9, a light emitting element 830 further includes only a protective layer 836 and other configurations are substantially the same and thus, a redundant description will be omitted.

Referring to FIGS. 8 and 9, each of a plurality of light emitting elements 830 includes the first semiconductor layer 131, the light emitting layer 132, the second semiconductor layer 133, the conductor layer 134, and the non-conductor layer 135, and the protective layer 836 surrounding a portion of them, which are sequentially disposed.

The protective layer 836 is an insulating layer for pro- tecting the first semiconductor layer 131 and the second semiconductor layer 133. The protective layer 836 sur- rounds the first semiconductor layer 131 and the second semiconductor layer 133 and thus, may prevent the first semiconductor layer 131 and the plurality of third lines 123 from being electrically connected, or the second semicon- ductor layer 133 and the connection electrode CE from being electrically connected.

The protective layer 836 may be disposed to surround an entire side surface of the second semiconductor layer 133, an entire side surface of the light emitting layer 132, and a portion of a side surface of the first semiconductor layer 131 adjacent to the light emitting layer 132. The protective layer 836 may be disposed to surround at least a portion of the first semiconductor layer 131 extending from the light emitting layer 132 and a portion of the second semiconductor layer 133 extending from the light emitting layer 132. By the protective layer 836 that surrounds the first semiconductor layer 131, it is possible to prevent the plurality of third lines 123 formed in central portions of the plurality of light emitting elements 830 and the first semiconductor layers 131 from being electrically connected to each other. In addition, by the protective layer 836 that surrounds the second semiconductor layer 133, it is possible to prevent the connection electrode CE formed on both ends of the plurality of light emitting elements 830 and the second semiconductor layers 133 from being electrically connected to each other.

If the plurality of third lines 123 that need to be electrically connected only to the second semiconductor layers 133 are connected up to the first semiconductor layers 131, or the connection electrode CE that needs to be electrically connected only to the first semiconductor layers 131 is electrically connected up to the second semiconductor layers 133, the display device 800 may be defective. Accordingly, the plurality of light emitting elements 830 may be protected by forming the protective layers 836 that cover the first semiconductor layers 131, the light emitting layers 132, and the second semiconductor layers 133 of the plurality of light emitting elements 830.

In this case, the protective layer 836 does not cover a portion of the first semiconductor layer 131 which is positioned at an end of the light emitting element 830, so that a portion of the first semiconductor layer 131 may be exposed from the protective layer 836. A portion of the first semiconductor layer 131 needs to be exposed to the outside of the protective layer 836 to electrically connect the connection electrode CE covering both ends of the plurality of light emitting elements 830 and the first semiconductor layers 131. Accordingly, the protective layer 836 covers only a portion of the side surface of the first semiconductor layer 131 adjacent to the light emitting layer 132 and does not cover a remaining portion thereof.

Meanwhile, the protective layer 836 may cover only a portion of the side surface of the second semiconductor layer 133, but may cover the entire side surface of the second semiconductor layer 133. Since the second semiconductor layer 133 and the plurality of third lines 123 may be connected through the conductor layer 134 at one side of the second semiconductor layer 133, the protective layer 836 may cover the entire side surface of the second semiconductor layer 133. However, according to design, the protective layer 836 may cover only a portion of the second semiconductor layer 133, but is not limited thereto.

In the display device 800 according to another embodiment of the present disclosure, the protective layers 836 that surround the first semiconductor layers 131, the light emitting layers 132, and the second semiconductor layers 133 of the plurality of light emitting elements 830 are formed, so that short-circuit defects between the plurality of the light emitting element 830 and the plurality of third lines 123 and the connection electrode CE may be prevented. The connection electrode CE that covers the both ends of the plurality of light emitting elements 830 may be electrically connected to the first semiconductor layers 131 at one ends of the plurality of light emitting elements 830. The plurality of third lines 123 that cover the central portions of the plurality of light emitting elements 830 may be electrically connected to the second semiconductor layers 133. However, when the connection electrode CE is formed to be in contact with the second semiconductor layers 133 at the central portions of the light emitting elements 830 due to a process error or the like, or the plurality of third lines 123 are formed to be in contact with the first semiconductor layers 131 at the ends of the light emitting elements 830, a short-circuit defect may occur. Therefore, by forming the protective layer 836 that surrounds a portion of the first semiconductor layer 131 except for an outermost end connected to the connection electrode CE, the light emitting layer 132, and the second semiconductor layer 133, short-circuit defects between the plurality of the light emitting elements 830 and the plurality of third lines 123 and the connection electrode CE may be prevented. In addition, even if the protective layer 836 is formed to cover an entirety of the second semiconductor layer 133, the plurality of third lines 123 and the second semiconductor layers 133 can be easily connected through the conductor layers 134 at one sides of the second semiconductor layers 133. Accordingly, in the display device 800 according to another embodiment of the present disclosure, by forming the protective layers 836 that cover the first semiconductor layers 131 and the second semiconductor layers 133 of the plurality of light emitting elements 830, it is possible to prevent a short-circuit defect occurring in a process of connecting the connection electrode CE and the plurality of third lines 123 to the light emitting elements 830.

Hereinafter, a method of manufacturing the light emitting element 830 of the display device 800 according to another embodiment of the present disclosure will be described with reference to FIGS. 10A to 10E.

FIGS. 10A to 10E are process views for explaining a method of manufacturing a light emitting element of a display device according to another embodiment of the present disclosure.

Figure 10A:
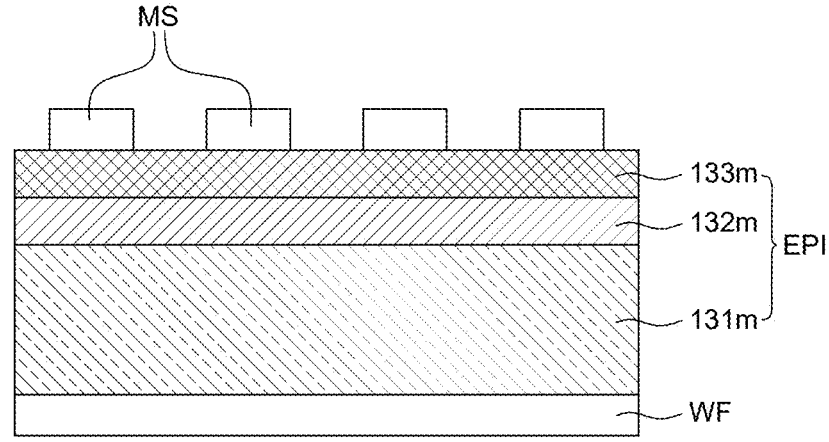
FIGS. 10A to 10E are process views for explaining a method of manufacturing a light emitting element of the display device according to another embodiment of the present disclosure.

Referring to FIG. 10A, an epitaxial layer EPI is formed on a growth substrate WF. Specifically, a first semiconductor material layer 131m, a light emitting material layer 132m, and a second semiconductor material layer 133m are sequentially formed on the growth substrate WF.

Figure 10B:
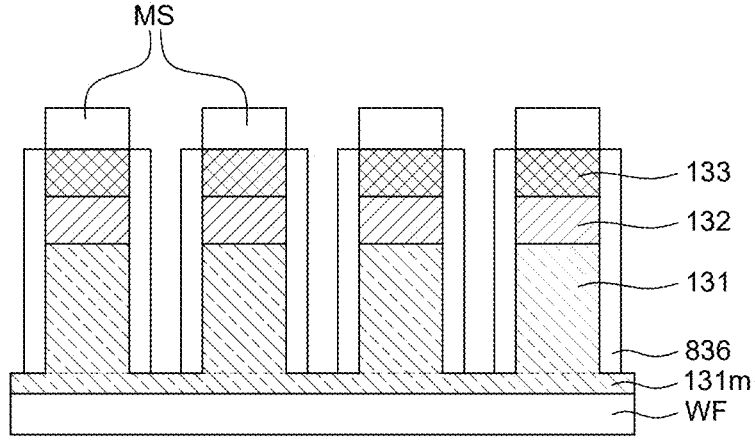

Referring to FIGS. 10A and 10B, a mask MS corresponding to the light emitting elements 830 is formed on the epitaxial layer EPI. The epitaxial layer EPI may be patterned by forming the mask MS, and the first semiconductor layers 131, the light emitting layers 132, and the second semiconductor layers 133 of the plurality of light emitting elements 830 may be formed.

Next, Referring to FIG. 10B, the protective layers 836 are formed on side surfaces of the first semiconductor layers 131, side surfaces of the light emitting layers 132, and side surfaces of the second semiconductor layers 133 on the growth substrate WF. A material constituting the protective layer 836 is formed on the growth substrate WF, so that the protective layer 836 covering the side surface of the first semiconductor layer 131, the side surface of the light emitting layer 132, and the side surface of the second semiconductor layer 133 can be formed. At this time, in FIG. 10B, although the protective layer 836 is shown to be formed only on the side surface of the first semiconductor layer 131, the side surface of the light emitting layer 132, and the side surface of the second semiconductor layer 133, the protective layer 836 may be formed on an entire surface of the growth substrate WF and formed up to an upper surface of the first semiconductor material layer 131m between each of the first semiconductor layers 131, but is not limited thereto.

Figure 10C:
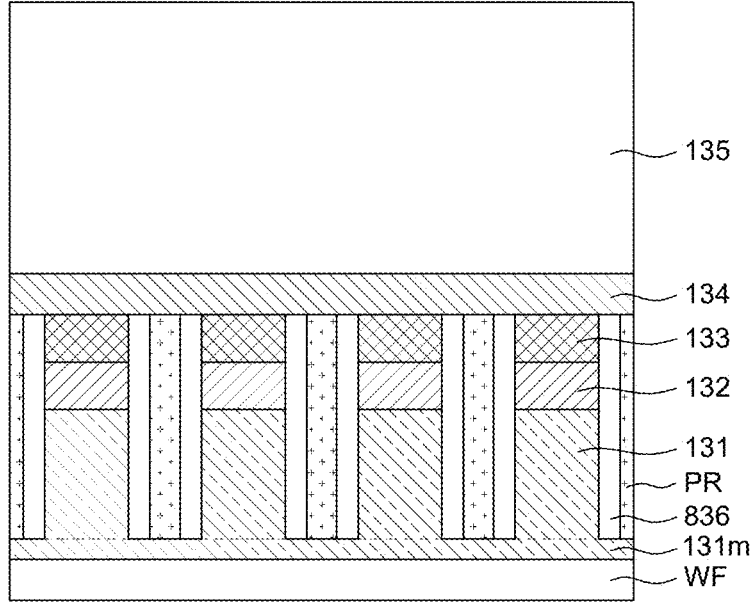

Next, referring to FIG. 10C, after the protective layers 836 are formed, the mask MS is removed and a temporary protective layers PR are formed on the entire surface of the growth substrate WF. After the temporary protective layers PR are formed, the conductor layer 134 and the nonconductor layer 135 are sequentially formed on the second semiconductor layer 133. The temporary protective layers PR may be, for example, a photoresist, but are not limited thereto.

The temporary protective layer PR is disposed to fill empty spaces between the first semiconductor layer 131, the light emitting layer 132, and the second semiconductor layer 133. The temporary protective layer PR may be formed in the empty space in the protective layer 836 of the light emitting element 830, so that the conductor layer 134 may be formed only on the second semiconductor layer 133. If the conductor layer 134 and the non-conductor layer 135 are formed on the growth substrate WF in the absence of the temporary protective layer PR, the conductor layer 134 and the non-conductor layer 135 may be formed up to the empty space between the protective layers 836. Therefore, the temporary protective layer PR may be formed in the empty space between the second semiconductor layers 133 so that the conductor layer 134 and the non-conductor layer 135 are disposed on only one surface of the second semiconductor layer 133.

Figure 10D:
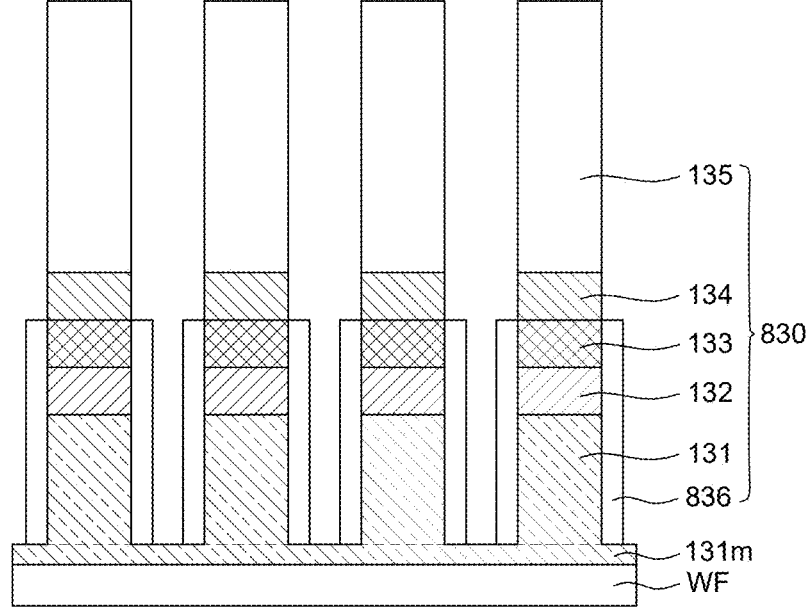

Referring to FIG. 10D, a portion of the conductor layer 134 and the non-conductor layer 135 that do not overlap the second semiconductor layer 133 is patterned using a mask MS, and the temporary protective layer PR is removed, so that the plurality of light emitting elements 830 including the first semiconductor layers 131, the light emitting layers 132, the second semiconductor layers 133, the conductor layers 134, the non-conductor layers 135, and the protective layers 836 are formed.

Only the conductor layer 134 and the non-conductor layer 135 that overlap the second semiconductor layer 133 may remain on the growth substrate WF by patterning the portion of the conductor layer 134 and the non-conductor layer 135 that do not overlap the second semiconductor layer 133. In addition, after the conductor layer 134 and the non-conductor layer 135 that do not overlap the second semiconductor layer 133 are removed, the temporary protective layer PR formed in the empty space between the protective layers 836 may be removed.

Figure 10E:
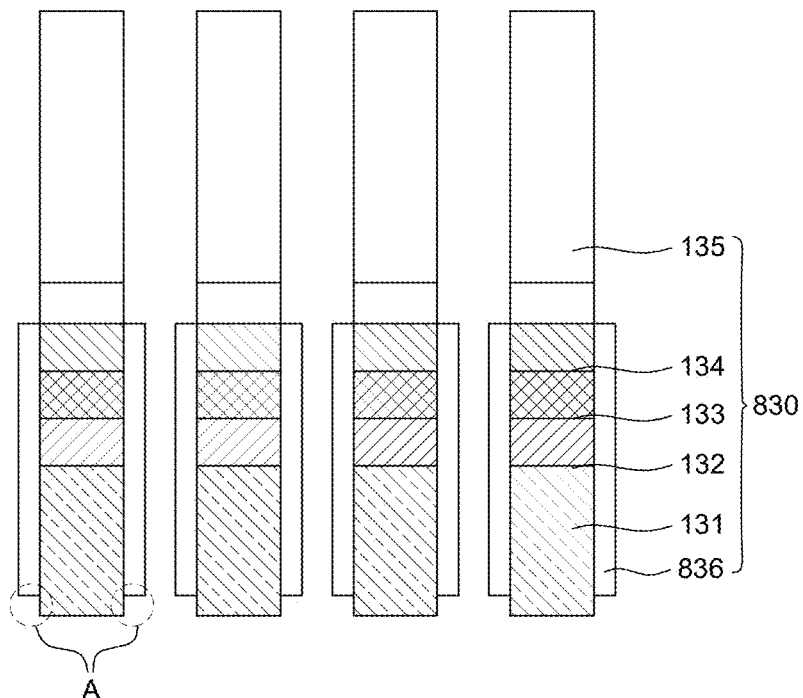

Finally, referring to FIG. 10E, the plurality of light emitting elements 830 are separated from the growth substrate WF. For example, the plurality of light emitting elements 830 and the growth substrate WE may be separated using a laser lift off (LLO) technology, a chemical lift off technology, or a stamp, but are not limited thereto.

In this case, a portion of the protective layer 836 that is disposed on a lower portion A of the side surface of the first semiconductor layer 131 may be lost in a process of separating the light emitting element 830 from the growth substrate WF. The portion of the protective layer 836 that covers the lower portion A of the side surface of the first semiconductor layer 131 may be separated from the first semiconductor layer 131 together with the growth substrate WF. Accordingly, a structure in which an outermost end of the first semiconductor layer 131 is exposed from the protective layer 836 may be formed. Accordingly, the connection electrode CE and the first semiconductor layer 131 may be electrically connected through the lower portion A of the side surface of the first semiconductor layer 131, which is exposed from the protective layer 836.

Accordingly, in the display device 800 and the method of manufacturing the display device 800 according to another embodiment of the present disclosure, the protective layers 836 may be formed only on the side surfaces of the first semiconductor layers 131, the light emitting layers 132, and the second semiconductor layers 133 of the plurality of light emitting elements 830 using the temporary protective layers PR. First, the epitaxial layer EPI may be grown on the growth substrate WF, so that the first semiconductor layers 131, the light emitting layers 132, and the second semiconductor layers 133 may be formed. In this state, the protective layers 836 surrounding the side surfaces of the first semiconductor layers 131, the light emitting layers 132, and the second semiconductor layers 133 are formed, and the temporary protective layers PR may be formed in empty spaces between the protective layers 836. In addition, the conductor layer 134 and the non-conductor layer 135 are formed on the temporary protective layers PR and the second semiconductor layers 133, so that formation of the plurality of light emitting elements 830 may be completed. If the conductor layer 134 and the non-conductor layer 135 are formed on the epitaxial layer EPI and the protective layer 836 is formed after patterning them all at once, it may be difficult to selectively form the protective layer 836 only on the side surfaces of the first semiconductor layer 131, the light emitting layer 132, and the second semiconductor layer 133. Unlike this, in the display device 800 and the method of manufacturing the display device 800 according to another embodiment of the present disclosure, in a state in which only the first semiconductor layer 131, the light emitting layer 132, and the second semiconductor layer 133 are formed, the protective layer 836 is formed in advance, and the temporary protective layer PR is formed in the empty space between the protective layer 836 so that the conductor layer 134 and the non-conductor layer 135 are formed only on the second semiconductor layer 133. Accordingly, the protective layer 836 that protects the first semiconductor layer 131, the light emitting layer 132, and the second semiconductor layer 133 can be easily formed.

The exemplary embodiments of the present disclosure can also be described as follows:

According to an aspect of the present disclosure, there is provided a display device. The display device includes a substrate, a plurality of first lines disposed on the substrate and spaced apart from each other, a plurality of second lines disposed on the substrate and disposed between the plurality of respective first lines, a plurality of light emitting elements disposed on the plurality of first lines and the plurality of second lines, and a plurality of third lines disposed on the plurality of light emitting elements. Each of the plurality of light emitting elements includes, a first semiconductor layer overlapping the plurality of first lines and electrically connected to the plurality of first lines and the plurality of second lines, a light emitting layer disposed at one side of the first semiconductor layer, a second semiconductor layer disposed at one side of the light emitting layer, a conductor layer disposed at one side of the second semiconductor layer and in contact with the plurality of third lines, and a non-conductor layer disposed at one side of the conductor layer and overlapping the plurality of second lines.

The light emitting layer may be disposed more adjacent to one end at which the first semiconductor layer is disposed among both ends of the light emitting element.

The conductor layer may be disposed at a central portion of the light emitting element.

Each of the plurality of light emitting elements may further include a protective layer surrounding the first semiconductor layer, the light emitting layer, and the second semiconductor layer.

The display device may further include an insulating layer disposed between the plurality of first lines and the plurality of light emitting elements and between the plurality of second lines and the plurality of light emitting elements, and a connection electrode disposed on the plurality of light emitting elements and electrically connecting the plurality of light emitting elements and the plurality of first lines and the plurality of second lines.

The connection electrode may be in contact with a portion of the plurality of first lines and a portion of the plurality of second lines that are exposed through contact holes in the insulating layer, and the first semiconductor layer and the non-conductor layer that are disposed at both ends of the light emitting element.

The display device may further include a driving transistor disposed on the substrate and electrically connected to the plurality of first lines and the plurality of second lines, and a common line disposed on the substrate and electrically connected to the plurality of third lines.

The display device may further include an additional insulating layer disposed between the plurality of light emitting elements and the plurality of third line. The plurality of third lines may be in contact with central portions of the plurality of light emitting elements through contact holes in the additional insulating layer.

According to another aspect of the present disclosure, there is provided a display device. A display device includes a substrate on which a plurality of sub-pixels are defined, a driving transistor disposed in each of the plurality of sub-pixels on the substrate, a plurality of light emitting elements disposed in each of the plurality of sub-pixels on the substrate, a plurality of first lines disposed between the driving transistor and the plurality of light emitting elements and electrically connected to the driving transistor, a plurality of second lines disposed between the plurality of first lines between the driving transistor and the plurality of light emitting elements and electrically connected to the driving transistor, and a plurality of third lines disposed on the plurality of light emitting elements and in contact with central portions of each of the plurality of light emitting elements. Each of the plurality of light emitting elements includes a first semiconductor layer electrically connected to the plurality of first lines and the plurality of second lines, a second semiconductor layer disposed at one side of the first semiconductor layer and electrically connected to the plurality of third lines, a conductor layer having at least a portion overlapping the central portion, and disposed at one side of the second semiconductor layer, and a non-conductor layer disposed at one side of the conductor layer.

Each of the plurality of light emitting elements may further include a protective layer covering a portion of the first semiconductor layer and the second semiconductor layer, and an outermost end of the first semiconductor layer may be exposed from the protective layer.

The display device may further include a planarization layer disposed between the driving transistor and the plurality of first lines and between the driving transistor and the plurality of second lines, and an insulating layer disposed between the plurality of first lines and the plurality of light emitting elements and between the plurality of second lines and the plurality of light emitting elements.

The display device may further include a common line disposed under the planarization layer. The plurality of third lines may be electrically connected to the common line through contact holes in the insulating layer and the planarization layer.

The display device may further include a connection electrode disposed on the insulating layer and the plurality of light emitting elements and in contact with the plurality of first lines and the plurality of second lines through contact holes in the insulating layer. The plurality of first lines may be in contact with the driving transistor through contact holes in the planarization layer. The plurality of second lines may be electrically connected to the driving transistor through the connection electrode and the plurality of first lines.

The connection electrode may cover the first semiconductor layer and the non-conductor layer of each of the plurality of light emitting elements.

The display device may further include an additional insulating layer disposed on the connection electrode and including contact holes through which central portions of the plurality of light emitting elements are exposed.

The plurality of light emitting elements disposed in one sub pixel among the plurality of sub pixels may include some light emitting elements in which the first semiconductor layers are arranged toward the plurality of first lines and other some light emitting elements in which the first semiconductor layers are arranged toward the plurality of second lines.

It will be apparent to those skilled in the art that various modifications and variations can be made in the display device and the method of manufacturing the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
a substrate;
a plurality of first lines disposed on the substrate and spaced apart from each other;
a plurality of second lines disposed on the substrate and disposed between the plurality of respective first lines;
a plurality of light emitting elements disposed on the plurality of first lines and the plurality of second lines; and
a plurality of third lines disposed on the plurality of light emitting elements between the plurality of first lines and the plurality of second lines,
wherein each of the plurality of light emitting elements includes,
a first semiconductor layer overlapping the plurality of first lines and electrically connected to the plurality of first lines and the plurality of second lines;
a light emitting layer disposed at one surface of the first semiconductor layer;
a second semiconductor layer disposed at one surface of the light emitting layer;
a conductor layer disposed at one surface of the second semiconductor layer and in contact with the plurality of third lines; and
a non-conductor layer disposed at one surface of the conductor layer and overlapping the plurality of second lines,
wherein the first semiconductor layer, the light emitting layer, the second semiconductor layer, the conductor layer and the non-conductor layer are arranged along a horizontal direction and disposed on a same plane,
wherein the first semiconductor layer, the light emitting layer, the second semiconductor layer, the conductive layer and the non-conductive layer have the same width in a vertical direction, and
wherein the plurality of third lines is in contact with an upper portion of the conductor layer and an upper portion of the non-conductor layer.

2. The display device of claim 1, wherein the light emitting layer is disposed adjacent to and closer to one end at which the first semiconductor layer is disposed among both ends of the light emitting element.

3. The display device of claim 1, wherein the conductor layer is disposed at a central portion of the light emitting element.

4. The display device of claim 1, wherein each of the plurality of light emitting elements further includes a protective layer surrounding the first semiconductor layer, the light emitting layer, and the second semiconductor layer.

5. The display device of claim 1, further comprising:

an insulating layer disposed between the plurality of first lines and the plurality of light emitting elements and between the plurality of second lines and the plurality of light emitting elements; and a connection electrode disposed on the plurality of light emitting elements and electrically connecting the plurality of light emitting elements and the plurality of first lines and the plurality of second lines.

6. The display device of claim 5, wherein the connection electrode is in contact with a portion of the plurality of first lines and a portion of the plurality of second lines that are exposed through contact holes in the insulating layer, and the first semiconductor layer and the non-conductor layer that are disposed at both ends of the light emitting element.

7. The display device of claim 5, further comprising:

a driving transistor disposed on the substrate and electrically connected to the plurality of first lines and the plurality of second lines; and a common line disposed on the substrate and electrically connected to the plurality of third lines.

8. The display device of claim 1, further comprising:

an additional insulating layer disposed between the plurality of light emitting elements and the plurality of third line, wherein the plurality of third lines are in contact with central portions of the plurality of light emitting elements through contact holes in the additional insulating layer.

9. A method of manufacturing a display device, comprising:

forming a plurality of first lines spaced apart from each other and a plurality of second lines between the plurality of first lines on a substrate;

forming a plurality of light emitting elements on the plurality of first lines and the plurality of second lines; and forming a plurality of third lines on the plurality of light emitting elements between the plurality of first lines and the plurality of second lines, wherein each of the plurality of light emitting elements includes, a first semiconductor layer overlapping the plurality of first lines and electrically connected to the plurality of first lines and the plurality of second lines;

a light emitting layer disposed at one surface of the first semiconductor layer;

a second semiconductor layer disposed at one surface of the light emitting layer;

a conductor layer disposed at one surface of the second semiconductor layer and in contact with the plurality of third lines; and a non-conductor layer disposed at one surface of the conductor layer and overlapping the plurality of second lines, wherein the first semiconductor layer, the light emitting layer, the second semiconductor layer, the conductor layer and the non-conductor layer are arranged along a horizontal direction and disposed on a same plane, wherein the first semiconductor layer, the light emitting layer, the second semiconductor layer, the conductive layer and the non-conductive layer have the same width in a vertical direction, and wherein the plurality of third lines is in contact with an upper portion of the conductor layer and an upper portion of the non-conductor layer.

10. The method of claim 9, wherein the plurality of light emitting elements are self-aligned by applying a voltage to the plurality of first lines and the plurality of second lines.

* * * * *